United States Patent
Chun

(10) Patent No.: US 6,809,255 B1
(45) Date of Patent: Oct. 26, 2004

(54) RADIO FREQUENCY GROUND SHIELD

(75) Inventor: Delo K. K. Chun, Laguna Niguel, CA (US)

(73) Assignee: Teledyne Technologies Incorporated, Los Angeles, CA (US)

( * ) Notice: Subject to any disclaimer, the term of this patent is extended or adjusted under 35 U.S.C. 154(b) by 0 days.

(21) Appl. No.: 10/201,465

(22) Filed: Jul. 23, 2002

(51) Int. Cl.$^7$ .............................................. H01B 5/00

(52) U.S. Cl. .................. 174/35 R; 174/35 C; 361/816; 361/818; 361/800; 439/92; 439/95; 439/607; 439/608; 439/609

(58) Field of Search ............................ 174/35 R, 35 C; 361/816, 818, 800; 439/92, 95, 607, 608, 609

(56) References Cited

U.S. PATENT DOCUMENTS 4,109,222 A * 8/1978 Frano et al. ................ 335/301
5,246,376 A * 9/1993 Schuhl et al. ................. 439/98

OTHER PUBLICATIONS

NAIS, SMD RELAYS, with 5GHz Capabilities.

* cited by examiner

*Primary Examiner*—Dean A. Reichard
*Assistant Examiner*—Jinhee Lee
(74) *Attorney, Agent, or Firm*—Kirkpatrick & Lockhart LLP

(57) ABSTRACT

An apparatus for protecting the conductor leads of an axial lead device includes a conductive shield having one or more openings configured to receive a plurality of conductor leads exiting from the axial lead device. The conductive shield may be structured and arranged to substantially surround a plurality of conductor leads received in the openings such that each conductor lead is isolated from at least one other conductor lead. The conductive shield may shunt radio frequency signals radiated by one or more of the plurality of conductor leads to a ground plane and isolate solder fillets and signal traces associated with the conductor leads when the axial lead device is surface mounted to a printed circuit board.

Relative to an axial lead device when surface mounted to a PCB without the conductive shield, an assembly including an axial lead device and the conductive shield demonstrates other isolation of radio frequency signals across contacts of the assembly, higher isolation of radio signals across poles of the assembly, lower return loss of radio frequency signals, lower insertion loss of radio frequency signals, lower propagation delay time, and/or shorter pulse rise time.

44 Claims, 24 Drawing Sheets

RADIO FREQUENCY GROUND SHIELD

TECHNICAL FIELD

The present invention relates generally to systems and techniques for improving RF (radio frequency) operating characteristics and protecting axial lead devices and more particularly to a conductive RF ground shield for improving RF operating characteristics and protecting conductor leads of axial lead devices, such as surface-mountable axial lead electromechanical relays.

BACKGROUND

Axial lead devices, such as electromechanical relays, for example, generally may be assembled to a printed circuit board (PCB) by inserting leads of the device into pre-drilled holes in the PCB and soldering the leads to lands (pads) in circuit traces on the PCB. Typically, the leads are soldered to the surface of the PCB opposite to the side on which the device is mounted. After soldering, excess leads extending beyond the solder fillet joints may be trimmed off close to the top of the solder fillet. This method of through-hole mounting adds manufacturing costs and has several disadvantages with respect to operating RF characteristics.

First, the through-hole assembly configuration has exposed solder fillets and residual short lead stubs. The residual lead stubs are the result of the traditional practice of lead trimming operations after soldering the leads to the PCB circuit traces and may affect RF performance characteristics. For instance, the solder fillets and lead stubs can radiate RF signals from one RF signal path to another RF signal path's solder fillets and lead stubs. Similarly, signals from one RF signal path pole's solder fillets and lead stubs can radiate and couple with other RF signal path poles' (for multipole relays) solder fillets and lead stubs. Second, the PCB's exposed RF signal circuit traces can radiate RF signals to other RF signal circuit traces and affect the relay's operating RF performance characteristics. Finally, in the through-hole assembly configuration, the leads extend through the thickness of the PCB material. Hence, radiated RF signals from RF signal leads also can couple with other RF signal leads through the PCB bulk material, thus affecting the relay's operating RF characteristics.

Attempts have been made to enhance the RF performance of through-hole assemblies, for example, by attaching ground connections to the device header base, cover, or other parts of the device enclosure and connecting such connections to the PCB's RF ground plane. However, in these configurations, RF signals still can radiate from the leads of one signal path and couple to the leads of another signal path, adversely affecting the performance characteristics of the device.

Axial lead devices also may to be mounted to a PCB using surface-mount manufacturing technology. When axial lead devices, such as electromechanical relays, are soldered to a PCB by surface mount technology, the device enclosure is generally spaced off of the PCB by the leads. The relay leads attached to the PCB commonly use a butt-lead configuration (i.e., a short lead intended for attachment perpendicular to a land structure) or some variant of formed leads, such as the L-bend configuration. In the butt-lead configuration, the bottom end and part of the vertical surfaces of the leads are attached directly to the circuit trace solder lands (pads) on the PCB via the solder fillets. In this case, the solder fillets are formed between the butt leads and solder pads to create the structural attachments and electrical connections. In the formed lead configuration, the lower ends of the formed leads in contact with the PCB circuit traces are soldered to the circuit traces accordingly.

In either surface mount attachment configuration, however, exposed leads may affect the device's RF performance characteristics. In the frequency domain, for example, the effects on the RF characteristics due to exposed leads in surface mounted axial lead electromechanical relays include, but are not limited to, reduced isolation across contacts, reduced isolation between poles (for multipole relays), increased return loss, and somewhat increased insertion loss beyond certain frequencies. Similar effects may be evident in the time domain with respect to parameters such as pulse rise time, propagation delay time, etc.

In general, degradation in RF performance characteristics may be due to RF signals that radiate off of one signal path's leads and solder fillets and couple to another signal path's leads and solder fillets. Radiated RF signals for a PCB signal path circuit trace to another signal path circuit trace, as mentioned above, on the PCB also affects the relays' RF performance characteristics. To a lesser extent, there is some minimal RF signal leakage from one path to another through the body of the PCB dielectric material.

Attempts have been made to improve the RF performance characteristics of such surface-mounted devices by adding grounding attachments (e.g., connection ground tabs, ground straps) to connect the device's conductive enclosure to the PCB's RF ground plane. For surface-mounted axial lead electromechanical relays, attempts at improving the operating RF characteristics have included the use of discrete grounding means between the relays' enclosure and the PCB RF ground plane. For example, grounding attachments have been added by welding one or more discrete ground pins to the bottom of the enclosure and soldering the bottom end of the ground pins to the PCB RF ground plane. This approach only partially shunts the undesired RF signals to the PCB's RF ground plane. As such, these designs have provided only marginal improvement of RF operating characteristics over a limited RF frequency bandwidth.

The number of grounding attachments increases the assembly manufacturing complexity, and the operating RF performance of such configurations still has limitations over a broad frequency band. With either the butt-lead or formed lead surface-mount configuration, radiated RF signals still can travel from one signal path to another even if grounding means are attached to the device. As such, only a fraction of the radiated signals are shunted to the PCB's RF ground plane. Similarly, radiated signals from one RF signal circuit trace on the PCB to another RF signal circuit trace may occur, even though some of the stray signals are shunted to the ground plane by a multitude of discrete grounding means attached to the device.

SUMMARY

In one general aspect, an apparatus for protecting an axial lead device includes a conductive shield having one or more openings configured to receive a plurality of conductor leads exiting from the axial lead device. The conductive shield may be structured and arranged to substantially surround a plurality of conductor leads received in the openings such that each conductor lead is isolated from at least one other conductor lead. The conductive shield may shunt radio frequency signals carried by one or more of the plurality of conductor leads to a ground plane and isolate traces associated with the conductor leads when the axial lead device is mounted to a printed circuit board. Relative to an axial lead device when used without the conductive shield, an assembly including the axial lead device and the conductive shield demonstrates higher isolation of radio frequency signals across contacts of the assembly, higher isolation of radio signals across poles of the assembly, lower return loss of radio frequency signals, lower insertion loss of radio frequency signals, lower propagation delay time, and/or faster pulse rise time. The conductive shield may be structured and arranged for use with an off-the-shelf axial lead electromechanical relay device.

Implementations may include one or more of the following features. For example, the conductive shield may include a single conductive plate and/or two or more conductive plates. The conductive shield may be constructed from one or more of a plated metal, an unplated metal, a semi-metallic material, a dielectric material with conductive plating, a combination of these and/or any other material that provides the improved operating characteristics identified above. The conductive shield may have a thickness substantially equal to a length from the axial lead device to a bottom surface of at least one conductor lead and/or may have a square perimeter, a circular perimeter, a rectangular perimeter, and/or a multi-sided curvilinear perimeter.

The openings may include slots and/or corner openings. In some cases, a slot may extend into a central portion of the conductive shield. The openings may be closed by an outer edge of the conductive shield and/or be configured to provide clearance with a circuit board trace associated with a received conductor lead. The openings also may define a plurality of extensions. Each extension may isolate a plurality of conductor leads and may extend from a central portion of the conductive shield to the periphery of the axial lead device, to within the periphery of the axial lead device, or outside the periphery of the axial lead device.

The conductive shield may have one or more walls that are relatively perpendicular to a top surface and/or a bottom surface of the conductive shield. Such walls may form the boundaries of the openings. In some cases, the walls may be curvilinear and/or tapered. The bottom surface of the conductive shield may be substantially coplanar with a bottom surface of at least one conductor lead. The top and/or bottom surface may have a smooth surface finish, an embossed surface finish, and/or an intermediate surface finish.

In another general aspect an assembly may include an axial lead device having a plurality of conductor leads exiting from the axial lead device and a conductive shield. The conductive shield may include one or more openings receiving the plurality of conductor leads. The conductive shield may substantially surround the plurality of conductor leads received on the openings such that each conductor lead is isolated from at least one other conductor lead. In such an assembly, the conductive shield may provide a common electrical path between the axial lead device enclosure and a RF ground plane. The openings may be located at a periphery of the assembly.

Implementations may include one or more of the following features. For example, the axial lead device may be an electromechanical relay, such as a double-pole/double-throw relay, a double-pole/single-throw relay, a single-pole/single-throw relay, and a singlepole/double-throw relay, variants of the aforementioned contact configurations, and/or other multi-pole relays. Such electromechanical relays may include components such as an internal coil suppression diode, a polarity reversal protection diode, a transistor coil driver circuit, and/or an internal attenuator pad.

The axial lead device also may be surface mounted to a printed circuit board. The axial lead device may include leads having a butt-lead configuration, an L-bend configuration, and/or some other configuration. The axial lead device may be operable in a de-energized state and/or an energized state. The axial lead device may be a latching axial lead device, such as a magnetic latching axial lead device. The axial lead device may have a square lead pattern, a circular lead pattern, a rectangular lead pattern, and/or some other lead pattern. In some cases, the axial lead device may include a conductor lead that exits from a central portion of the axial lead device.

The conductive shield may be attached to the axial lead device by laser welding, resistance welding, soldering, use of a conductive adhesive, and/or some other attachment method. The conductive shield also may be integral with the axial lead device. For example, the conductive shield may form part of an enclosure of the axial lead device, such as part of the enclosure base of the axial lead device.

The conductive shield also may be attached by conductive means to a printed circuit board radio frequency ground plane. The conductive shield may be attached to the printed circuit board by one or a combination of: attaching by conductive means all of a bottom surface of the conductive shield to the printed circuit board radio frequency ground plane, attaching by conductive means the bottom surface of the conductive shield to the printed circuit board radio frequency ground plane at discrete locations, attaching by conductive means extension side surfaces of the conductive shield to a printed circuit board radio frequency ground plane, and touching substantially all of the bottom surface of the conductive shield to a printed circuit board radio frequency ground plane.

DETAILED DESCRIPTION

Figure 1A:
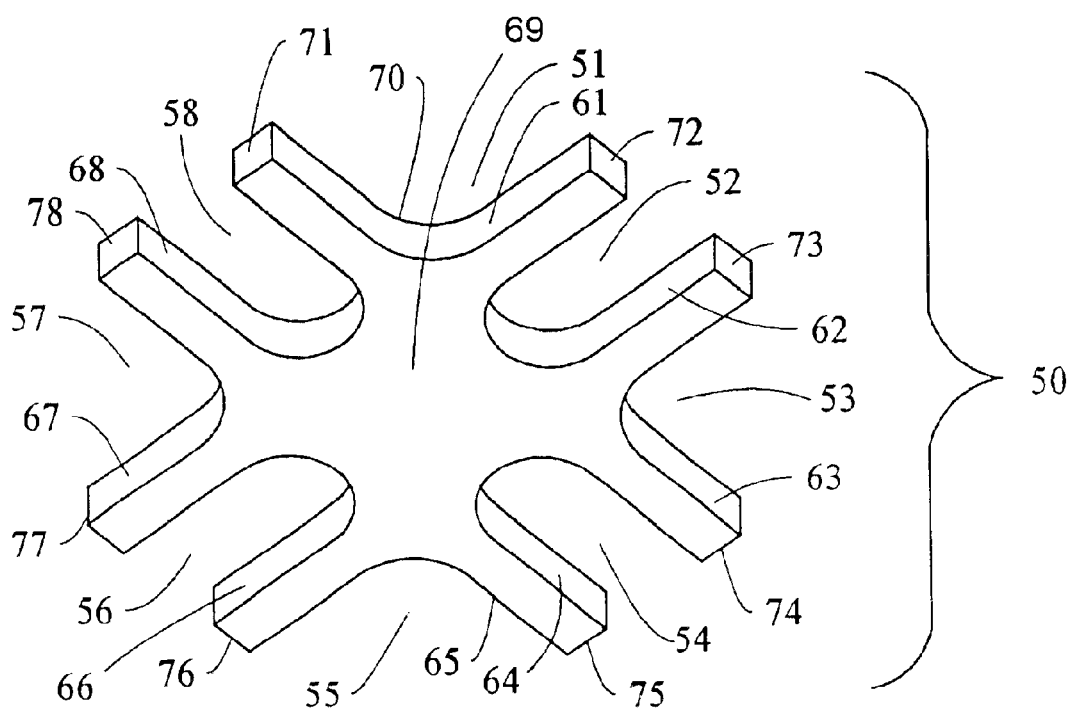
FIG. 1A illustrates one embodiment of an apparatus according to aspects of the present invention.

FIG. 1A depicts aspects of one embodiment of a radio frequency (RF) ground shield 50. In general, the RF ground shield 50 may provide physical protection for conductor leads of an axial lead device against damage and deformation during handling, testing, shipping, and assembly to printed circuit boards. When assembled to the bottom of an enclosure of an axial lead device, the RF ground shield 50 may be structured and arranged to almost completely surround axial leads exiting the device and portions of associated RF signal circuit traces of a printed circuit board (PCB). The RF ground shield 50, therefore, may be capable of isolating and shunting undesirable radiated RF signals from exposed external RF signal leads and associated circuit traces to an RF ground plane of the PCB.

Referring to FIG. 1A, the RF ground shield 50 may include a conductive metal plate having a first corner opening 51, a first slot 52, a second corner opening 53, a second slot 54, a third corner opening 55, a third slot 56, a fourth corner opening 57, and fourth slot 58. As shown, the corner openings 51, 53, 55, 57 and slots 52, 54, 56, 58 open to the outside and may therefore allow for cleaning and inspection processes when the RF ground shield 50 is included in a surface-mounted assembly. For example, when the RF ground shield 50 is attached to a printed circuit board, the corner openings 51, 53, 55, and 57 and slots 52, 54, 56, and 58 may be open to the periphery of a surface-mounted assembly. The openings 51, 53, 55, and 57 and slots 52, 54, 56, and 58, therefore, allow for cleaning residuals off of the printed circuit board and around the solder joint areas during post assembly manufacturing cleaning operations. The openings 51, 53, 55, and 57 and slots 52, 54, 56, and 58 also provide access for visual inspections after soldering operations, or access to solder joints requiring rework operations.

In this embodiment, the RF ground shield 50 includes a bottom surface 69 and a top surface 70 that are relatively parallel to each other and relatively perpendicular to a first curvilinear wall 61, second curvilinear wall 62, a third curvilinear wall 63, a fourth curvilinear wall 64, a fifth curvilinear wall 65, a sixth curvilinear wall 66, a seventh curvilinear wall 67, and an eighth curvilinear wall 68. As shown, the curvilinear walls 61–68 form the boundaries of corner openings 51, 53, 55, 57 and slots 52, 54, 56, and 58 respectively.

The bottom surface 69 and the top surface 70 also are relatively perpendicular to a first extension side surface 71, a second extension side surface 72, a third extension side surface 73, a fourth extension side surface 74, a fifth extension side surface 75, a sixth extension side surface 76, a seventh extension side surface 77, and an eighth extension side surface 78. As shown, the first extension side surface 71 interfaces the first curvilinear wall 61 and the eighth curvilinear wall 68. The second extension side surface 72 interfaces first curvilinear wall 61 and the second curvilinear wall 62. The third extension side surface 73 interfaces the second curvilinear wall 62 and the third curvilinear wall 63. The fourth extension side surface 74 interfaces the third curvilinear wall 63 and the fourth curvilinear wall 64. The fifth extension side surface 75 interfaces the fourth curvilinear wall 64 and the fifth curvilinear wall 65. The sixth extension side surface 76 interfaces the fifth curvilinear wall 65 and the sixth curvilinear wall 66. The seventh extension side surface 77 interfaces the sixth curvilinear wall 66 and the seventh curvilinear wall 67. And, the eighth extension side surface 78 interfaces the seventh curvilinear wall 67 and the eighth curvilinear wall 68. Further, the extension side surfaces 71–78 interface the RF ground shield bottom surface 69 and the RF ground shield top surface 70.

In some implementations, the RF ground shield 50 may be configured for attachment to an axial lead device, such as an electromechanical relay. One example of an electromechanical relay is a double-pole/double-throw relay. Other examples include, but are not limited to a double-pole/single-throw relay, a single-pole/single-throw relay, a single-pole/-double-throw relay, variants of the aforementioned contact configurations, and/or other multi-pole relays. The electromechanical relay may include components such as, for example, internal coil suppression diodes, polarity reversal protection diodes, and/or transistor coil driver circuits. The electromechanical relay also may include internal attenuator pads.

In general, the design of the RF ground shield 50 may allow existing off-the-shelf axial lead devices (e.g., electromechanical relays) to be readily and effectively used, for example, in surface-mount configurations in RF applications, at higher signal frequencies without substantial changes to the internal design and technology of the devices. For instance, the RF ground shield 50 may be used with off-the-shelf axial lead electromechanical relays having conductive bottom enclosures and leads trimmed to butt-lead configurations, or cut and formed into L-bend or other surface mount forms. When attached to the conductive enclosure of a relay, the RF ground shield 50 forms part of a high performance, surface mountable, RF electromechanical relay assembly.

When configured for attachment to an axial lead device, the RF ground shield 50 typically may be designed as a one-piece construction made from a monolithic metal plate of conductive plated metal to enhance assembly and conductivity. The RF ground shield 50, however, may be made from various materials and, in some cases, may be formed from two or more plates. Examples of materials that may be used to form the RF ground shield 50 include, but are not limited to: unplated metals, semi-metallic materials, dielectric material (e.g., molded polymers) plated with conductive metal, combinations of the aforementioned, and/or any other material capable of achieving the enhanced RF operating characteristics described below.

In other implementations, the RF ground shield 50 may be constructed as an integral part of an axial lead device (e.g., electromechanical relay). For instance, the RF ground shield 50 may be integrated into a relay's enclosure base, usually referred to as the header base. In general, the header base is the glass-to-metal hermetic seal portion of the enclosure and may be joined with a cover to form a hermetic enclosure. All possible variants of the RF ground shield 50 described herein may be implemented by making the RF ground shield 50 an integral part of a header blank used to manufacture the header base. Such one-piece header base design may provide RF performance advantages and physical protection to relay leads and further make the manufacturing processes and relay assembly process more cost-effective. Economic benefits may be realized, for example, by eliminating the need to manufacture, inventory, assemble, and/or otherwise process separate ground shield and header base components. In such implementations, surface-mountable RF relay assemblies with enhanced operating RF performance characteristics, but minimized manufacturing processing and assembly steps may be realized.

Figure 1B:
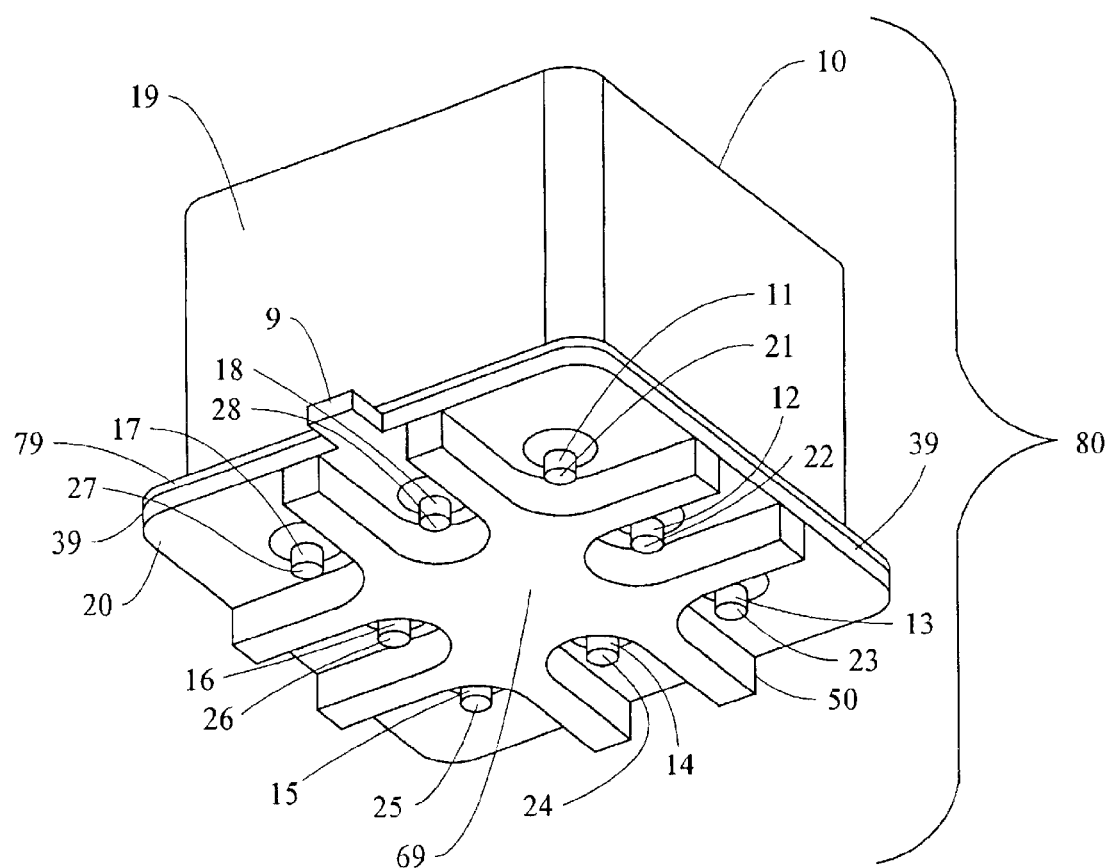
FIG. 1B illustrates one embodiment of an assembly according to aspects of the present invention.

FIG. 1B illustrates one embodiment of an assembly 80 in accordance with aspects of the present invention. The assembly 80 generally includes an axial lead device protected by a RF ground shield 50. In this implementation, the axial lead device may include an electromechanical relay 10, for example, a double pole-double throw electromechanical relay, having a metal cover 19 and a header base 20. The metal cover 19 and the header base 20 may form an enclosure for internal electromechanical components of the relay 10. For instance, the header base 20 may include a header base flange 39 that may be joined together (e.g., welded, soldered, adhered) to a cover flange 79 of the metal cover 19 to form a hermetic seal. The header base 20 also may include a header base tab 9 for manipulating (e.g., positioning, mounting, etc.) the relay 10 and/or assembly 80.

In this embodiment, the relay 10 includes a first electrical conductor lead 11, a second electrical conductor lead 12, a third electrical conductor lead 13, a fourth electrical conductor lead 14, a fifth electrical conductor lead 15, a sixth electrical conductor lead 16, a seventh electrical conductor lead 17, and an eighth electrical conductor lead 18 exiting from the bottom of the header base 20. Generally, the conductor leads 11–18 may connect to one or more electromechanical components within the enclosure of the relay 10 and may include respective lead bottom surfaces 21–28 configured for attachment to a printed circuit board (PCB). For example, the leads 11–18 may be attached to a PCB using a butt-lead configuration (i.e., short leads intended for attachment perpendicular to a circuit land structure). In some cases, the leads 11–18 may be trimmed such that one or more of the lead bottom surfaces 21–28 and/or the RF ground shield bottom surface 69 are substantially coplanar.

Figure 1C:
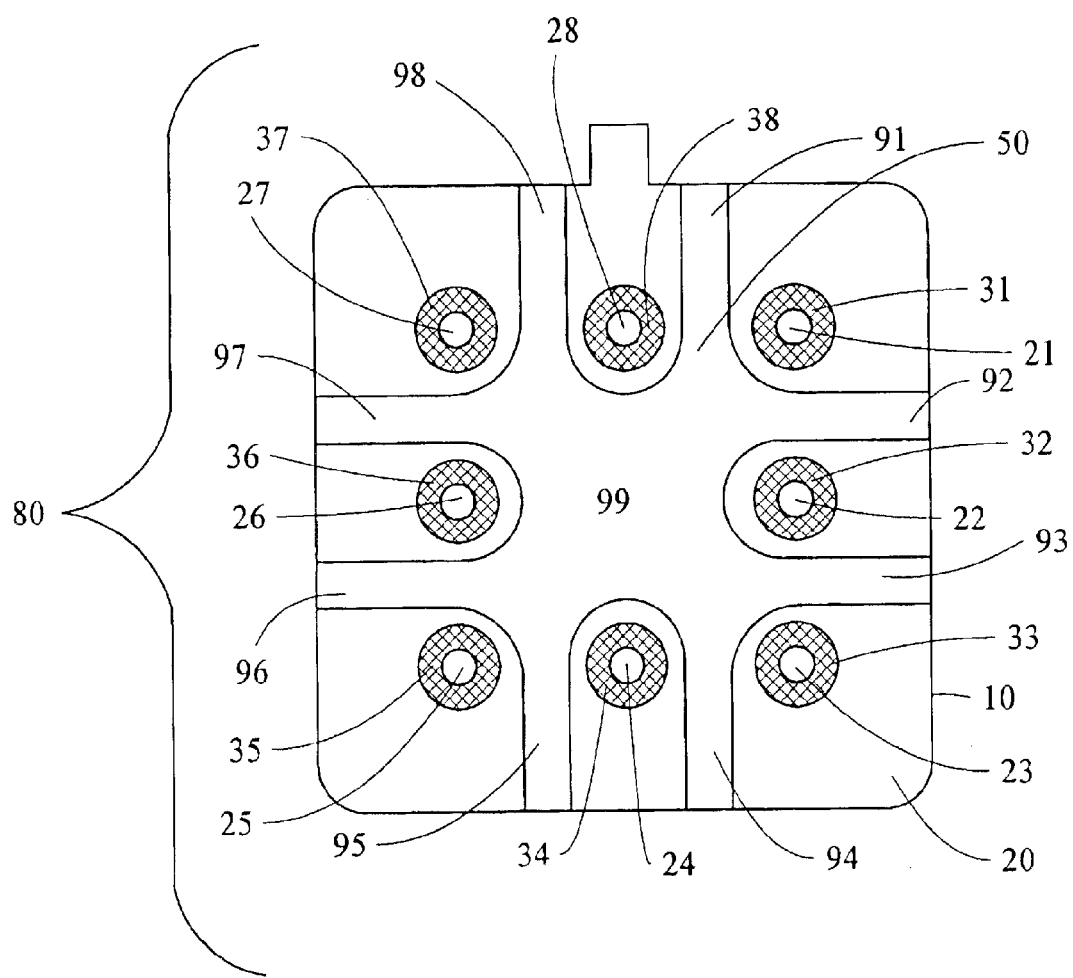
FIG. 1C illustrates a bottom view of one embodiment of an assembly according to aspects of the present invention.

FIG. 1C illustrates a bottom view of one embodiment of the assembly 80. In this embodiment, the RF ground shield 50 may be attached to the header base 20 and/or may include, form part of, or otherwise be integral with the header base 20. Additionally, each of the leads 1–18 may be electrically insulated from the conductive metal portion of the header base 20 by corresponding glass insulators 31–38. Generally, each lead-to-glass insulator interface and header base hole-to-glass insulator interface may form a hermetic seal such that collectively with the cover 19 and header base 20 attached, a conductive, hermetic enclosure is formed.

As shown, the RF ground shield 50 may include a first extension 91, a second extension 92, a third extension 93, a fourth extension 94, a fifth extension 95, a sixth extension 96, a seventh extension 97, and an eighth extension 98 that extend outwardly from a central portion 99 to the periphery of the header base 20. In general, the extensions 91-98 form barriers between each of the individual leads 11–18. In this implementation, the first extension 91 is bounded on the sides by the first curvilinear wall 61 and the eighth curvilinear wall 68 (see FIG. 1A). The second extension 92 is bounded on the sides by the first curvilinear wall 61 and the second curvilinear wall 62. The third extension 93 is bounded on the sides by the second curvilinear wall 62 and the third curvilinear wall 63. The fourth extension 94 is bounded on the sides by the third curvilinear wall 63 and the fourth curvilinear wall 64. The fifth extension 95 is bounded on the sides by the fourth curvilinear wall 64 and the fifth curvilinear wall 65. The sixth extension 96 is bounded on the sides by the fifth curvilinear wall 65 and the sixth curvilinear wall 66. The seventh extension 97 is bounded on the sides by the sixth curvilinear wall 66 and the seventh curvilinear wall 67. And, the eighth extension 98 is bounded on the sides by the seventh curvilinear wall 67 and the eighth curvilinear wall 68. Further, the extensions 91–98 and the central portion 99 are bounded on the bottom by the RF ground shield bottom surface 69 and are bounded on the top by the RF ground shield top surface 70. These barriers may provide functional performance benefits to the assembly 80 when used in RF signal applications.

As described above, the RF ground shield 50 may be attached to the header base 20 and/or may include, form part of, or otherwise be integral with the header base 20. Attachment of the RF, ground shield 50 may be accomplished in a variety of ways, such as, for example: laser welding, resistance welding, soldering, conductive adhesives, a combination of some or all of the foregoing, and/or any other equivalent method. In addition, the attachment of the RF ground shield 50 to an axial lead device may be at one or more different locations of the RF ground shield-to-axial lead device interface.

Figure 1D:
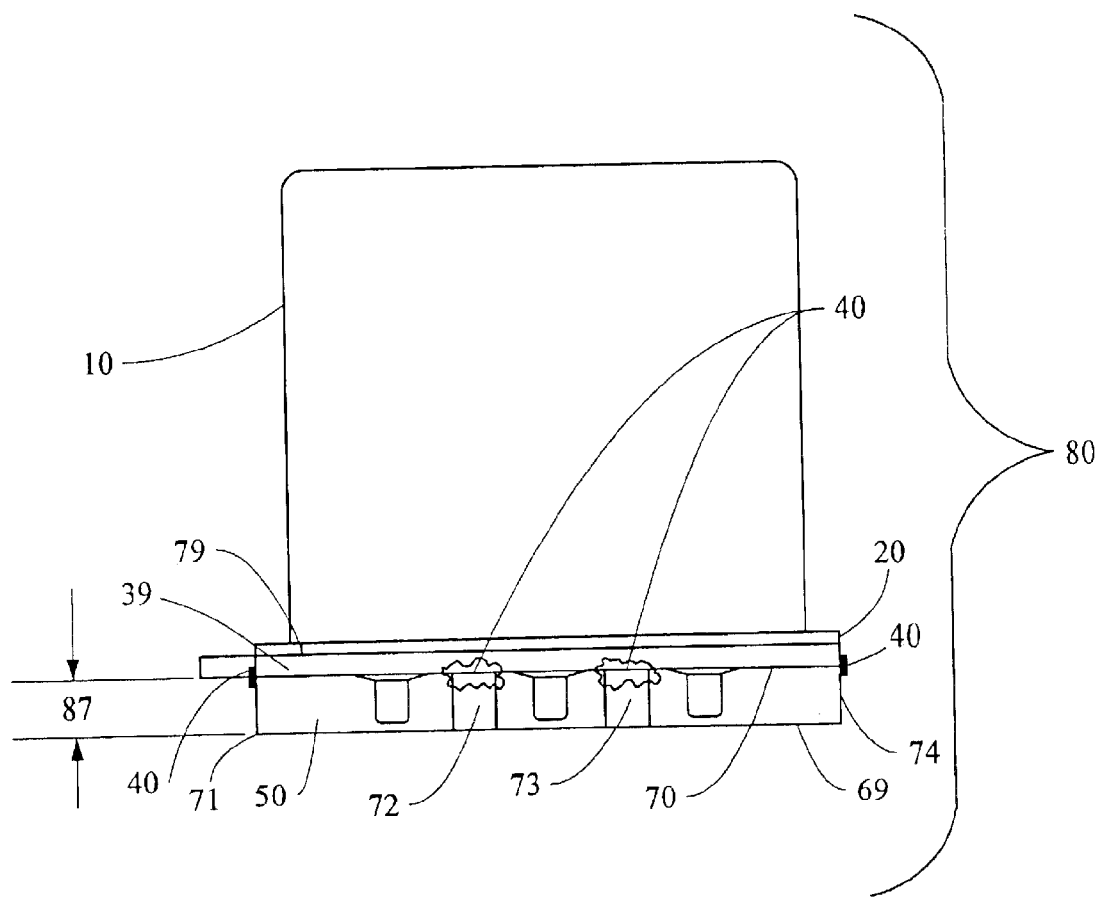
FIG. 1D illustrates a side view of one embodiment of an assembly according to aspects of the present invention.

FIG. 1D illustrates a side view of one embodiment of an assembly 80 in which attachment of the RF ground shield 50 is accomplished by laser and/or resistance welding. Attachment may be implemented by laser welding, for example, by using tack welds 40 at the upper portions of the RF ground shield extension side surfaces 71–78 to localized areas on the header base flange 39 of the header base 20 and to the periphery of the cover flange 79. Attachment also may be implemented by resistance welding, for example, by welding the RF ground shield top surface 70 to the metallic portion of header base 20. Other embodiments may employ various attachment methods.

FIG. 1D also depicts an implementation of an assembly 80 in which the leads 11–18 may be trimmed such that the length of each lead from the header base 20 to the lead bottom surfaces 21–28 (see FIG. 1B) is approximately equal to the thickness 87 of the RF ground shield 50.

Figure 1E:
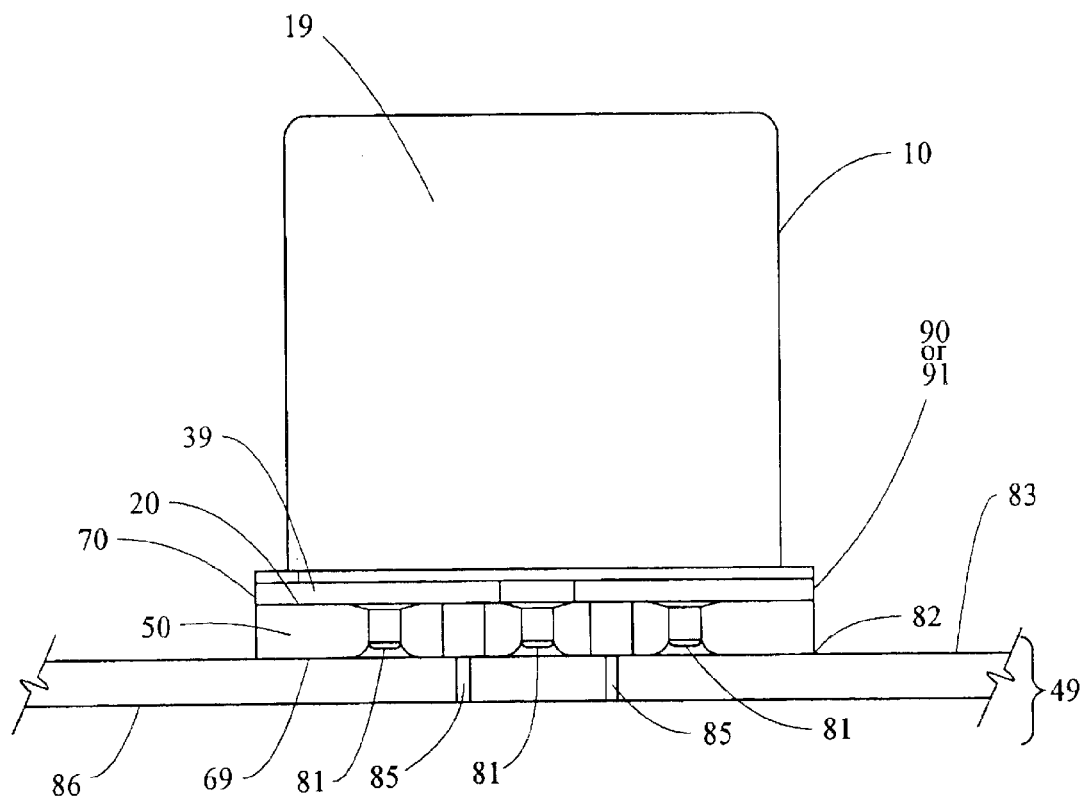
FIG. 1E illustrates a side view of one embodiment of an assembly according to aspects of the present invention.

FIG. 1E illustrates a side view of one embodiment of an assembly 80 in which attachment of the RF ground shield 50 is accomplished by soldering and/or by use of conductive adhesives. Attachment may be implemented, for example, by use of solder. 90 and/or conductive adhesive 91 between the RF ground shield top surface 70 and the metallic portion of header base 20.

FIG. 1E also depicts an implementation in which the assembly 80 may be surface mounted to a printed circuit board (PCB) 49. Mounting the assembly 80 to the PCB 49 may include soldering the RF ground shield bottom surface 69 to a component side RF ground plane 82 on the top surface 83 of the PCB 49. The component side RF ground plane 82 also may be connected to a PCB bottom side RF ground plane 86 by way of several conductive vias 85. In this implementation, solder fillets 81 may provide electrical connections between leads of the assembly 80 and circuit trace lands of the PCB 49. In general, the attachment or inclusion of the RF ground shield 50 and the bottom surface of the header base 20 provides a common electrical path to the RF ground plane 82 by connecting the metallic cover 19, the metallic portion of the header base 20, and the metallic RF ground shield 50.

Figure 1F:
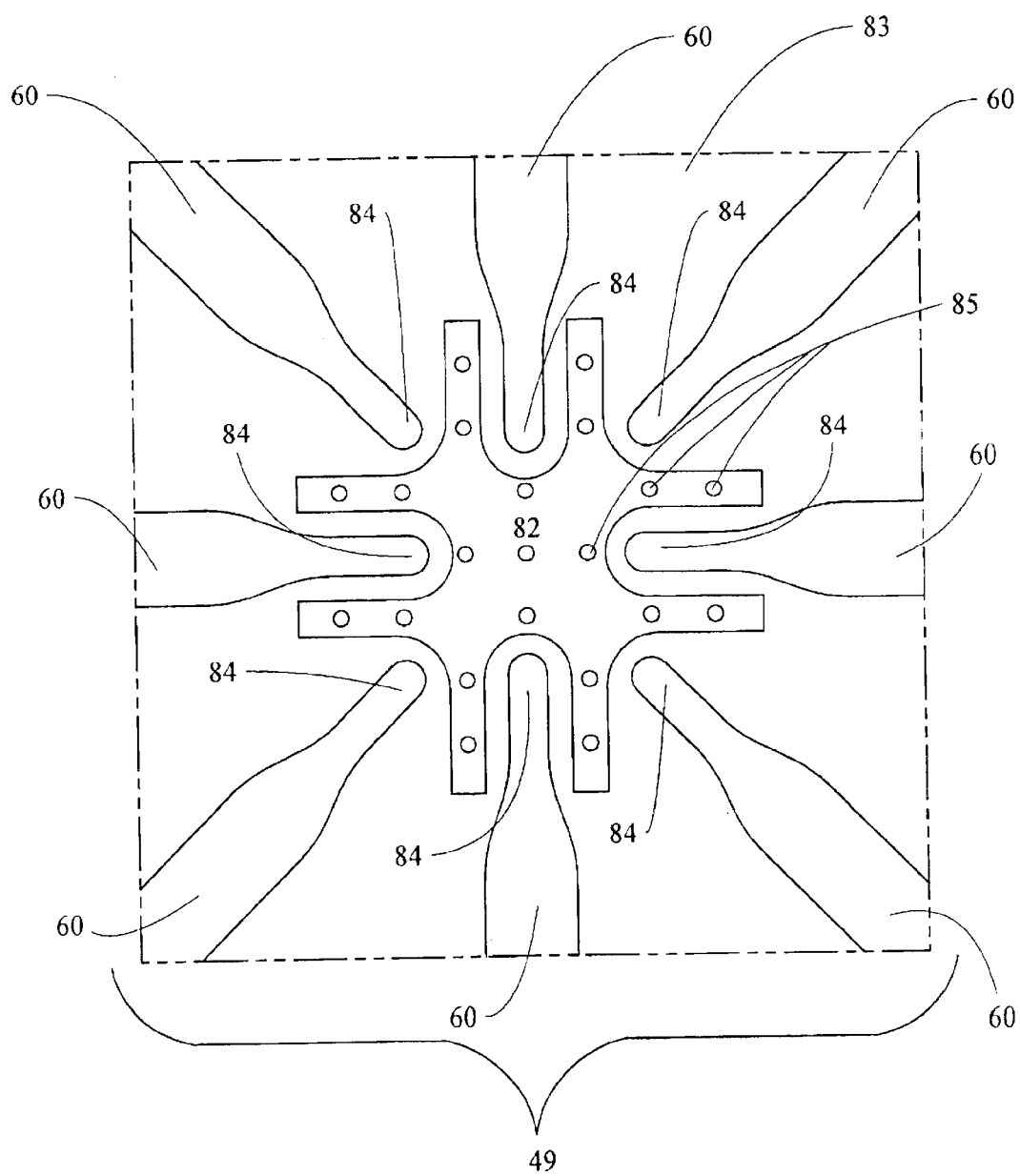
FIG. 1F illustrates one embodiment of a printed circuit board according to aspects of the present invention.

FIG. 1F illustrates a top view of one embodiment of a printed circuit board (PCB) 49 in accordance with aspects of the present invention. In this embodiment, the PCB 49 may be configured for use with a surface mountable device. As shown, the top surface 83 of the PCB 49 includes a component side RF ground plane 82 and several RF signal circuit traces 60. Each of the individual circuit traces 60 includes a circuit trace lands 84, also referred to as solder pads, in proximity to the component side RF ground plane 82. A plurality of conductive vias 85 connect component side RF ground plane 82 to a PCB ground plane 86 on the bottom side of PCB 49.

The component side RF ground plane 82 and the circuit trace lands 84 generally may be structured and arranged for attachment to a surface mountable device. In some implementations, the size, shape, and/or location of the component side RF ground plane 82 and/or the circuit trace lands 84 may be designed for use with a particular type of surface mountable device, such as, for example, an assembly 80 (see FIG. 1B). In such cases, the shape of the component side RF ground plane 82 may have a shape that generally corresponds to the shape of the RF ground shield bottom surface 69 of the assembly 80. The assembly 80 may be attached to the PCB 49, for example, by soldering the RF ground shield bottom surface 69 of the assembly to the RF ground plane 82. In addition, each of the leads 11–18 of the assembly 80 may be electrically connected to a circuit trace land 84 of a corresponding circuit trace 60 by soldering and/or any other equivalent process.

Other embodiments may use variations of component side RF ground plane 82 and means to electrically connect the component side RF ground plane 82 to the PCB bottom side RF ground plane 86. For example, in some cases, the entire bottom surface 69 of the RF ground shield 50 may be attached to the component ground plane pattern on the PCB. In other cases, the extensions 91–98 and/or the central portion 99 of the RF ground shield 50 may be designed for attachment to the PCB component side ground plane 82 only at discrete locations—for example, on the perimeter of the RF ground shield extensions 91–98. In some implementations, the RF ground shield bottom surface 69 may have a variety of surface finishes ranging from smooth to embossed. In other implementations, a RF gasket (not shown) may be utilized between the RF ground shield 50 and the PCB component side RF ground plane 82. Further implementations may employ various other attachment methods.

Figure 1G:
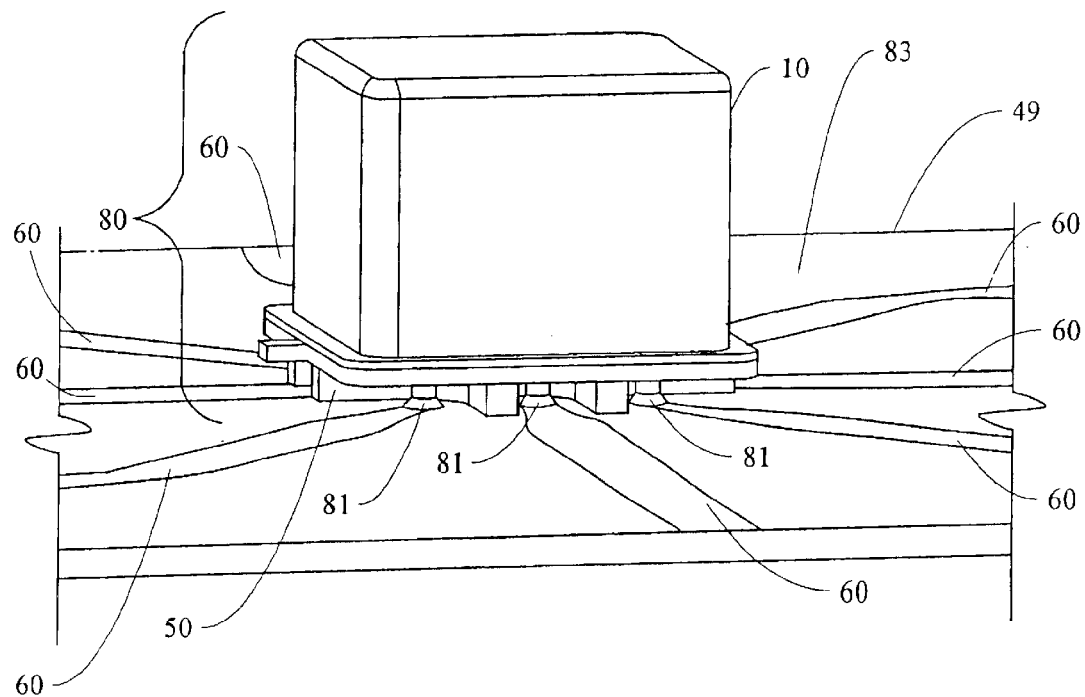
FIG. 1G illustrates one embodiment of assembly attached to a circuit board according to aspects of the present invention.

FIG. 1G shows one embodiment of an assembly 80 attached to a PCB 49 in accordance with aspects of the present invention. In this embodiment, the assembly 80 may be mounted to the top surface 83 of a PCB 49, as described above. As shown, solder fillets 81 may provide electrical connections between leads of the assembly and the circuit traces 60.

Improvements in RF performance characteristics that may be provided by the RF ground shield 50 are described below. In general, such improvements may be measured by comparing the RF performance characteristics of an axial lead device, such as an electromechanical relay, when used with and without a RF ground shield.

Regarding the RF frequency domain, the RF ground shield 50 generally may provide one or more of the following improvements in RF operating characteristics. For example, the RF ground shield may provide increased isolation across contacts resulting in less RF signal leakage from one contact signal path to the next contact signal path. In addition, increase isolation between poles (e.g., for multipole relays) may be provided resulting in less RF signal leakage from one pole's signal path to the next pole's signal path. Return loss (or voltage standing wave radio, VSWR) also may be reduced—i.e., there may be less reflected RF signal from the output port returning to the RF signal input port of the assembly. And, insertion loss may be reduced—i.e., less input signal power may be lost between the input and output ports of the relay assemblies.

Regarding the RF time domain, the RF ground shield 50 generally may provide for one or more of the following improvements in RF operating characteristics. For example, the propagation delay time of the digital RF signal through the relay assembly may be shortened—i.e. the time for the signal to pass from the input to output of the relay assembly may be less. THe pulse rise time of the digital input signal also may be shortened—for example, the time for the amplitude of the digital signal to rise from 10% to 90% of maximum may be less.

The resulting improvements in RF operating characteristics may lead to further benefits. For example, improvements in RF operating characteristic may allow the use of surface-mounted axial lead electromechanical relays over a broader frequency bandwidth. Additionally, improvements in RF operating characteristics may allow expanded use of axial lead electromechanical relays in multi-layer PCB RF signal switching applications.

To provide a better understanding of the advantages that may be provided by the RF ground shield, a comparison of the RF operating characteristics of an axial lead device when used with and without a RF ground shield is described below.

Figure 1H:
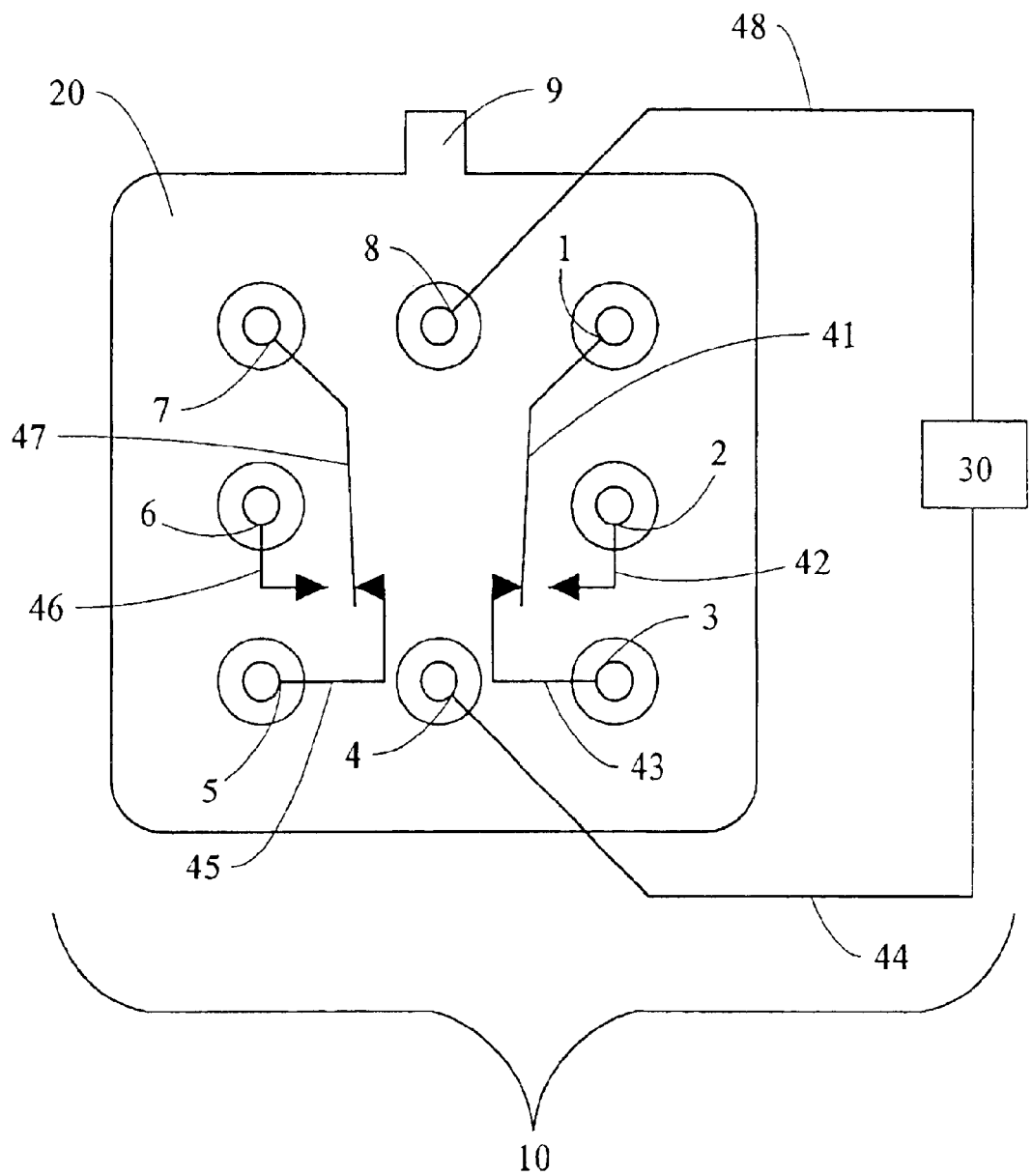
FIG. 1H illustrates a bottom view of an axial lead device, with superimposed functional schematic, according to aspects of the present invention.

FIG. 1H shows a bottom view of an exemplary axial lead device configured to illustrate aspects of the present invention. In this implementation, the axial lead device includes an electromechanical relay 10 having a header base 20 with header base tab 9. Within the relay 10, electromechanical components are attached to individual conductor leads 11–18 as follows: the first conductor lead 11 is connected to a first common moving contact 41, the second conductor lead 12 is connected to a first normally open contact 42, the third conductor lead 13 is connected to a first normally closed contact 43, the fourth conductor lead 14 is connected to a first coil connection 44 of coil 30, the fifth conductor lead 15 is connected to a second normally closed contact 45, the sixth conductor lead 16 is connected to a second normally open contact 46, the seventh conductor lead 17 is connected to a second common moving contact 47, and the eighth conductor lead 18 is connected to a second coil connection 48 of coil 30.

Points of connection are depicted in FIG. 1H as connections 1 through 8. In this implementation, the first common moving contact 41, the first normally closed contact 43, and the first normally open contact 42 form one contact pole, referred to as Pole 1. The second common moving contact 47, the second normally closed contact 45, and the second normally open contact 46 form another contact pole, referred to as Pole 2. Contact sets with a first common moving contact 41, a first normally closed contact 43, and a first normally open contacts 42, and similarly contact sets with a second common moving contact 47, a second normally closed contact 45, and a second normally open contacts 46 are known in the industry as double throw contacts.

When no voltage is applied across the fourth conductor lead 14 and the eighth conductor lead 18, and consequently no voltage is applied across the first coil connection 44 and the second coil connection 48, the relay 10 is in a de-energized state. In such cases, the first common moving contact 41 makes physical contact with the first normally closed contact 43, and similarly, the second common moving contact 47 makes physical contact with the second normally closed contact 45.

In the de-energized state, the relay 10 may be used in RF signal switching applications through Pole 1, for example. In such cases, the RF signals pass from an associated circuit trace up through the first conductor lead 11, through the first common moving contact 41, through the first normally closed contact 43, then through the third conductor lead 13, and out through a corresponding circuit trace, or vice versa. Similarly, if RF signals arc also sent through Pole 2, the RF signals pass through a corresponding circuit trace, up through the seventh lead 17, through the second common moving contact 47, through the second normally closed contact 45, then through the fifth conductor lead 15, and out through a corresponding circuit trace, or vice versa.

When the relay 10 is in the de-energized state, Pole 1 and Pole 2 may be connected externally by a passive device, for example, to the PCB circuit traces corresponding to the third conductor lead 13 and the fifth conductor lead 15. In such cases, the RF signals pass through the first conductor lead 11, through the first common moving contact 41, through the first normally closed contact 43, through third conductor lead 13, out through a corresponding circuit trace through the passive device, through the fifth conductor lead 15, through the second normally closed contact 45, through the second common moving contact 47, through the seventh conductor lead 17, and out through a corresponding circuit trace, or vice versa.

When voltage is applied across the conductor lead 14 and the conductor lead 18, and consequently voltage is applied across the first coil connection 44 and the second coil connection 48, the relay 10 is in an energized state. In such cases, a magnetic field developed in coil 30 causes a mechanism inside the relay 10 to move the first common moving contact 41 to transfer from the first normally closed contact 43 to the first normally open contact 42, and similarly, causes the second common moving contact 47 to transfer from the second normally closed contact 45 to the second normally open contact 46. In the energized state, both of the first common moving contact 41 and the second common moving contact 47 make physical contact with the first normally open contact 42 and the second normally open contact 46, respectively.

When relay 10 is in the energize state and Pole 1 is used, the RF signals pass through a corresponding circuit trace, through the first conductor lead 1, through the first common moving contact 41, through the first normally open contact 42, through the second conductor lead 12, then through a corresponding circuit trace, or vice versa. Similarly, if RF signals also are sent through Pole 2, the RF signals pass through a corresponding circuit trace, through the seventh conductor lead 17, through the second common moving contact 47, through the second normally open contact 46, through the sixth conductor lead 16, and out through a corresponding circuit trace, or vice versa.

In the energized state, Pole 1 and Pole 2 may be connected externally by a passive devise to the PCB circuit trace corresponding to the second conductor lead 12 and the sixth conductor lead 16. In such cases, the RF signals pass through a corresponding circuit trace to the first conductor lead 11, through the first common moving contact 41, through the first normally open contact 42, through the second conductor lead 12, out through a corresponding circuit trace through the passive device, through the sixth conductor lead 16, through the second normally open contract 46, through the second common moving contact 47, through the seventh conductor lead 17, then out through a corresponding circuit trace, or vice versa.

In general, RF signals may be used at various frequencies from a few kilohertz to many gigahertz and, as such, are frequency dependent and consist of an electrical component and an electromagnetic component. The electrical component of such signals move through the RF signal path electrical conductors at or near the surface of the conductors, depending on the frequency. The electromagnetic component of such signals radiate outwardly off of the conductors' surfaces and surround the outer surfaces of the signal conductors. The direction of rotation of the electromagnetic field around the signal conductors follows the classical "right hand" rule of physics. Radiated RF signals from one signal path that is picked-up and carried by another signal path is not desirable in RF signal applications. Such fugitive signals may adversely affect the RF performance characteristics (metrics) of the switching devices.

When electromechanical relays are used in RF radio frequency signal transmitting and/or receiving applications, metrics in the frequency domain, such as: 1) isolation across contacts, 2) isolation between poles for multipole relays, 3) insertion loss, and/or 4) return loss or voltage standing wave ratio (VSWR) may determine the suitability and/or utility of the selected switching device.

Ideal RF switching devices (e.g., electromechanical relays) generally may have the following frequency domain metrics: 1) maximum RF signal isolation across contacts—i.e., for a given pole, leakage of RF signals from the normally closed signal path to the normally open signal path, or vice versa, is minimized; 2) maximum RF signal isolation between poles for multipole relays—(e.g., a double pole relay) leakage of RF signals from one pole's signal path to the other pole's signal path is minimized; 3) minimum RF signal insertion loss—i.e., loss of signal level power from the devices' input port to output port is minimized; and 4) minimum RF signal return loss—i.e., reflected signal level from a device's output port to input port is minimized.

For digital applications, the metrics in the time domain may include: 1) minimum propagation time delay—i.e., the time for the digital RF signal to pass from the device's input port to the output port should be the shortest time possible; and 2) minimum pulse rise time—i.e., the time for the amplitude of the RF digital signal pulse to rise from 10% to 90% of maximum value, for example, should be the shortest time possible.

The above-identified RF performance metrics may be affected by the mechanism and contact design internal to the electromechanical relay and also by the leads external to the bottom of the header base. When an axial lead device, such as electromechanical relay 10 is surface mounted to a PCB 49 without the RF ground shield 50 connecting the conductive enclosure of the relay 10 to the PCB component side RF ground plane 82, the result is inferior RF performance metrics.

For example, if the RF ground shield 50 is not utilized in the configuration of FIG. 1H, there may be no provisions to shield one RF signal path from another RF signal path's fugitive radiated signals and ultimately shunt such undesirable radiated signals to the RF ground plane. To illustrate, in the de-energized state, a RF signal passes through an associated circuit trace, up through the first conductor lead 11, through the first common moving contact 41, through the first normally closed contact 43, down through the third conductor lead 13, and out through the associated circuit trace 60. As such, it may often be the case that radiated signals from the first conductor lead 11 and the third conductor lead 13 and their associated circuit traces are picked-up and carried by the second conductor lead 12 and its associated circuit trace. Such "leakage" of signal to the latter RF signal path results in undesirable signals being carried in the first normally open contact 42 of the output signal path. Therefore, the isolation across the normally closed contact signal path and the normally open contact signal path tends to be minimized rather than offering a maximized isolation across contact condition.

Furthermore, radiated signals from the first conductor lead 11 and the third conductor lead 13 of Pole 1, also may be picked-up and carried by one or more of the fifth conductor lead 15, the sixth conductor lead 16, and the seventh conductor lead 17 and associated traces of Pole 2. If Pole 2 is used as an independent signal path from Pole 1, then the fugitive "leakage" signals from Pole 1 are undesirable signals carried in the RF signal paths of Pole 2. Hence, the isolation between both poles is at a minimum rather than a desired maximum isolation between poles condition.

Additionally, for the normally closed contact signal path, fugitive radiated signals from the first conductor lead 11 and associated circuit trace and the third conductor lead 13 and associated circuit trace may interact. An interaction of radiated signals from the output signal path to the input signal path may appear at the input signal path as an increase in reflected RF signal back to the input circuit. Such interaction of radiated RF signals may affect the return loss from the output port associated with the third conductor lead 13 and the input port associated with the first conductor lead 11 tending to maximize the return loss rather than creating the desired minimized return loss condition. This affect on the device's return loss also affects the insertion loss characteristic by causing an increase in insertion loss rather than the desired minimized insertion loss from the input port associated with the first conductor lead 11 to the output port associated with the third conductor lead 13.

The previous discussions generally are applicable to implementations where the RF signal direction is reversed with the input signal path at the first conductor lead 13 and the output signal path at the first conductor lead 11.

A similar case can be illustrated with the coil 30 in the energized mode where a RF signal passes from an associated circuit trace up through the first conductor lead 11, through the first common moving contact 41, through the first normally open contact 42, down through the second conductor lead 12, and out through an associated circuit trace. Namely, in many cases, radiated signals from the first conductor lead 11 and the second conductor lead 12 and their associated circuit traces may be picked-up and carried by the third conductor lead 13 and its associated circuit trace. Such "leakage" of signal to the latter RF signal path results in undesirable signals in the signal path of the first normally closed contact 43. Therefore, the isolation across the normally open contact signal path and the normally closed contact signal path tends to be minimized rather than maximized with respect to the isolation across contacts.

Furthermore, radiated signals from the first conductor lead 11 and the second conductor lead 12 of Pole 1 also may be picked-up by one or more of the fifth conductor lead 15, the sixth conductor lead 16, and the seventh conductor lead 17 of Pole 2. If Pole 2 is used as an independent signal path from Pole 1, then the fugitive "leakage" signals from Pole 1 are undesirable signal inputs to Pole 2's RF signal paths. Hence, the isolation between both poles is at a minimum rather than at a desired maximum isolation between poles condition.

Additionally, for the normally open contact signal path, fugitive radiated signals from the first conductor lead 11 and associated circuit trace and the second conductor lead 12 and associated circuit trace may interact. The interaction of radiated signals from the output signal path to the input signal path may appear at the input signal path as an increase in reflected RF signal back to the input circuit. Such interaction of radiated RF signals affects the return loss from the output port associated with the second conductor lead 12 and the input port associated with the first conductor lead 11 tending to maximize the return loss rather than creating the desired minimized return loss condition. This affect on the device's return loss also affects the corresponding insertion loss characteristics by causing an increase in insertion loss rather than the desired minimized insertion loss from the input port associated with the first conductor lead 11 to the output port associated with the second conductor lead 12.

The previous discussions generally are applicable to implementations where the RF signal direction is reversed with the input signal path at the second conductor lead 12 and the output signal path at the first conductor lead 11.

According to aspects of the present invention, the RF ground shield 50 attempts to overcome the deficiencies noted above by providing means for isolating and shunting radiated signals from each RF signal path lead, solder fillet, and some portions of the PCB RF signal circuit traces. In general, radiated RF signals from applicable relay leads and radiated RF signals from solder fillets and portions of the PCB's RF signal circuit traces are contained and shunted to the PCB's RF ground plane. This isolation of the individual signal path's leads and shunting of unwanted radiated signals to the PCB's RF ground plane may result in increased RF signal isolation across contacts, increased RF signal isolation across poles (for multipole devices), reduced RF signal return loss, and/or reduced RF signal insertion loss. These RF operating characteristics show measurable improvement over a broader frequency bandwidth when compared to the RF performance characteristics for surface-mounted axial lead relays with or without the assistance of other discrete grounding attachments.

For example, when one surface of the RF ground shield 50 is attached to or integral with the bottom surface of the enclosure of the relay 10 and the other surface of the RF ground shield 50 is soldered to the printed circuit board ground plane, as described above, enhanced RF performance characteristics are realized over a broader frequency bandwidth. In particular, when the RF ground shield 50 is attached to axial lead surface-mounted relays, the RF operating characteristics of the assembly 80 are improved over a broader frequency range as compared to RF applications where the leads of an axial lead electromechanical relay are mounted to single-layer printed circuit boards using traditional "through-hole" solder mounting techniques, or surface mounted butt-leads to printed circuit board without a conductive ground shield.

Referring again to FIG. 1C, for example, the RF ground shield 50 may include eight extensions 91–98 and a central portion 99 in some embodiments. The extensions 91–98 and the central portion may form barriers between each of the individual leads 11–18 of the relay 10 and provide functional performance benefits to the assembly 80 when used in RF radio frequency signal applications.

To illustrate, with RF ground shield 50 attached to or integral with the electromechanical relay 10, the conductor leads 11–18 attached to the circuit trace lands 84 of associated circuit traces 60 of the PCB 49, and the RF ground shield bottom surface 69 attached to the component side RF ground plane 82 of the PCB 49 improved RF performance characteristics are realized. In such implementations, the respective surfaces of the extensions 91–98 surround the individual conductor leads 11–18 and form a conductive barrier between adjacent conductor leads 11–18 and portions of associated circuit traces 60. Namely, the second extension 92 separates the first conductor lead 11 and the second conductor lead 12, the third extension 93 separates the second conductor lead 12 and the third conductor lead 13, the fourth extension 94 separates the third conductor lead 13 and the fourth conductor lead 14, the fifth extension 95 separates the fourth conductor lead 14 and the fifth conductor lead 15, the sixth extension 96 separates the fifth conductor lead 15 and the sixth conductor lead 16, the seventh extension 97 separates the sixth conductor lead 16 and the seventh conductor lead 17, and the eighth extension 98 separates the seventh conductor lead 17 and the eighth conductor lead 18. In addition, the RF ground shield central portion 99 may be integrally connected to the extensions 91–98 and also provide a conductive barrier between the conductor leads 11–18 and portions of associated circuit traces 60.

The following discussion addresses the benefits of an attached or integral RF ground shield 50 with respect to RF performance characteristics of the electromechanical relay 10, as depicted in FIG. 1H.

In the relay coil de-energized state, RF signals pass from an input port associated circuit trace and the first conductor lead 11 to the third conductor lead 13 and output port associated circuit trace. In implementations using the RF ground shield 50, radiated signals from the first conductor lead 11, an associated solder fillet 81, and the shielded portion of the associated circuit trace and from the third conductor lead 13, associated solder fillet 81, and shielded portion of the associated circuit trace are shunted to component side RF ground plane 82 and then to PCB ground plane 86 by way of conductive vias 85. Therefore, substantially all of the fugitive radiated RF signals from the first conductor lead 11 and the third conductor lead 13 are shunted to ground before the fugitive radiated signals can be picked-up and carried by the second conductor lead 12, the associated solder fillet, and the associated circuit trace. This shunting of fugitive radiated RF signals to PCB RF ground plan 86 due to RF ground shield 50, extensions 91–98, and central portion 99 results in increased signal isolation in Pole 1 between the normally closed contact signal path and normally open contact signal path, thus achieving the objective of maximizing the isolation across contacts.

Figure 1K:
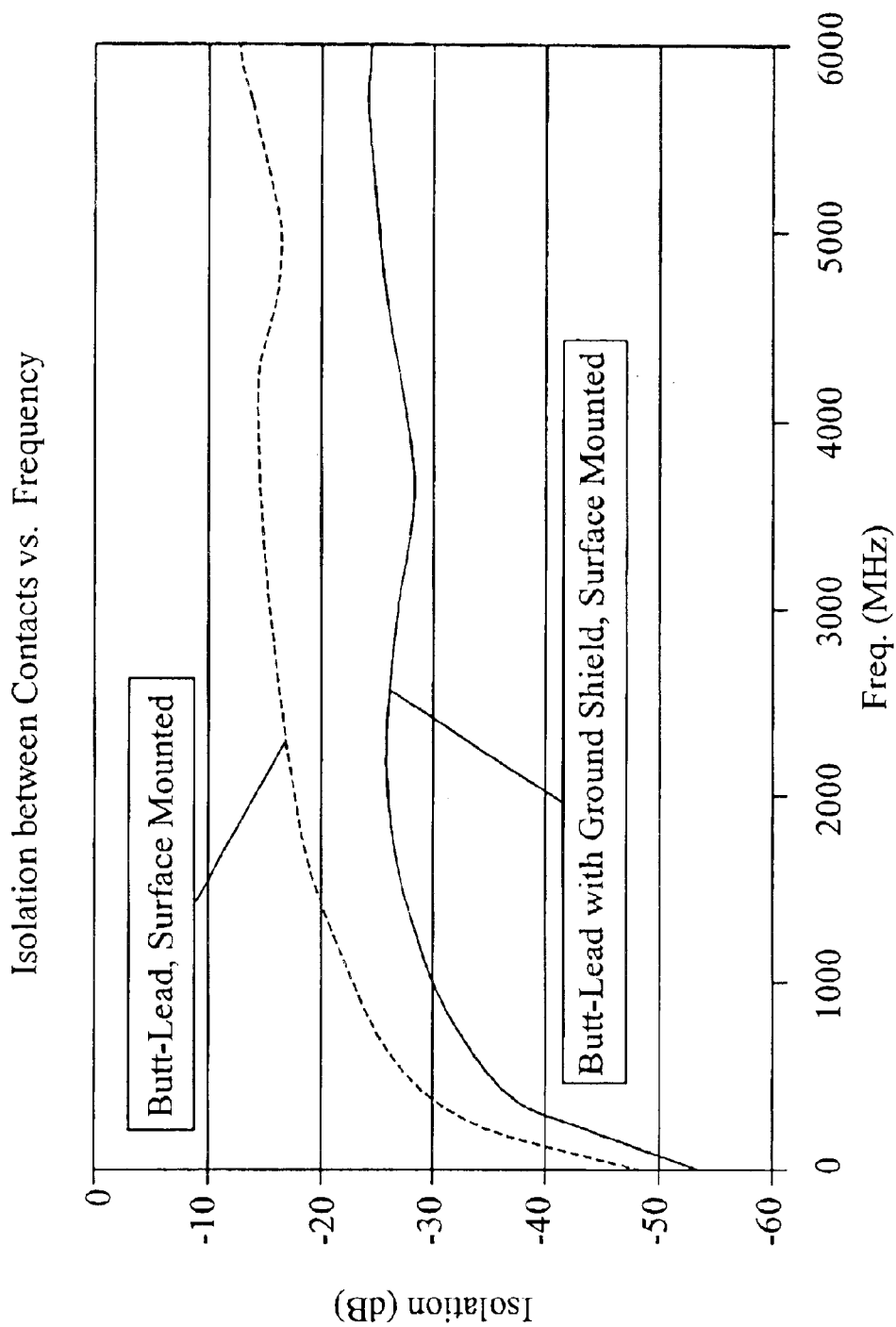
FIGS. 1K-1N illustrate representative plots according to aspects of the present invention.

FIG. 1K shows representative plots of isolation between the normally closed and normally open contact signal paths versus RF signal frequency. The broken line plot corresponds to a surface mounted butt-lead electromechanical relay when used without a RF ground shield 50. The solid line plot corresponds to the same type of relay when used with a RF ground shield 50 attached to its enclosure, and surface mounted to a RF test PCB. As demonstrated by the plots, the electromechanical relay with the RF ground shield 50 shows significantly higher RF signal isolation across contacts over the frequency range.

For the relay coil de-energized state, when RF signals are passed through the normally closed contact path, the signals pass from the input port through an associated circuit trace, associated solder fillet, and the first conductor lead 11 to the output port through the third conductor lead 13, associated solder fillet, and associated circuit trace. Fugitive radiated signals from the first conductor lead 11, associated solder fillet, and shielded portion of the associated circuit trace and from the third conductor lead 13, associated solder fillet 81, and shielded portion of the associated circuit trace are shunted to component side RF ground plane 82 and then to PCB ground plane 86 by way of conductive vias 85. Therefore, substantially all of the fugitive radiated RF signals from the third conductor lead 13, associated solder fillet, and the associated trace are shunted to RF ground before such fugitive signals can be picked up and carried by the first conductor lead 11, associated solder fillet, and the associated circuit trace, or vice versa. This shunting of fugitive radiated RF signals to PCB RF ground plane 86 due to the effects of RF ground shied 50, extensions 91–98, and the central portion 99 results in minimal return of RF signals from the output signal path associated with the third conductor lead 13 to the input signal path associated with the first conductor lead 11, thereby minimizing the RF signal return loss from output to input ports.

Figure 1L:
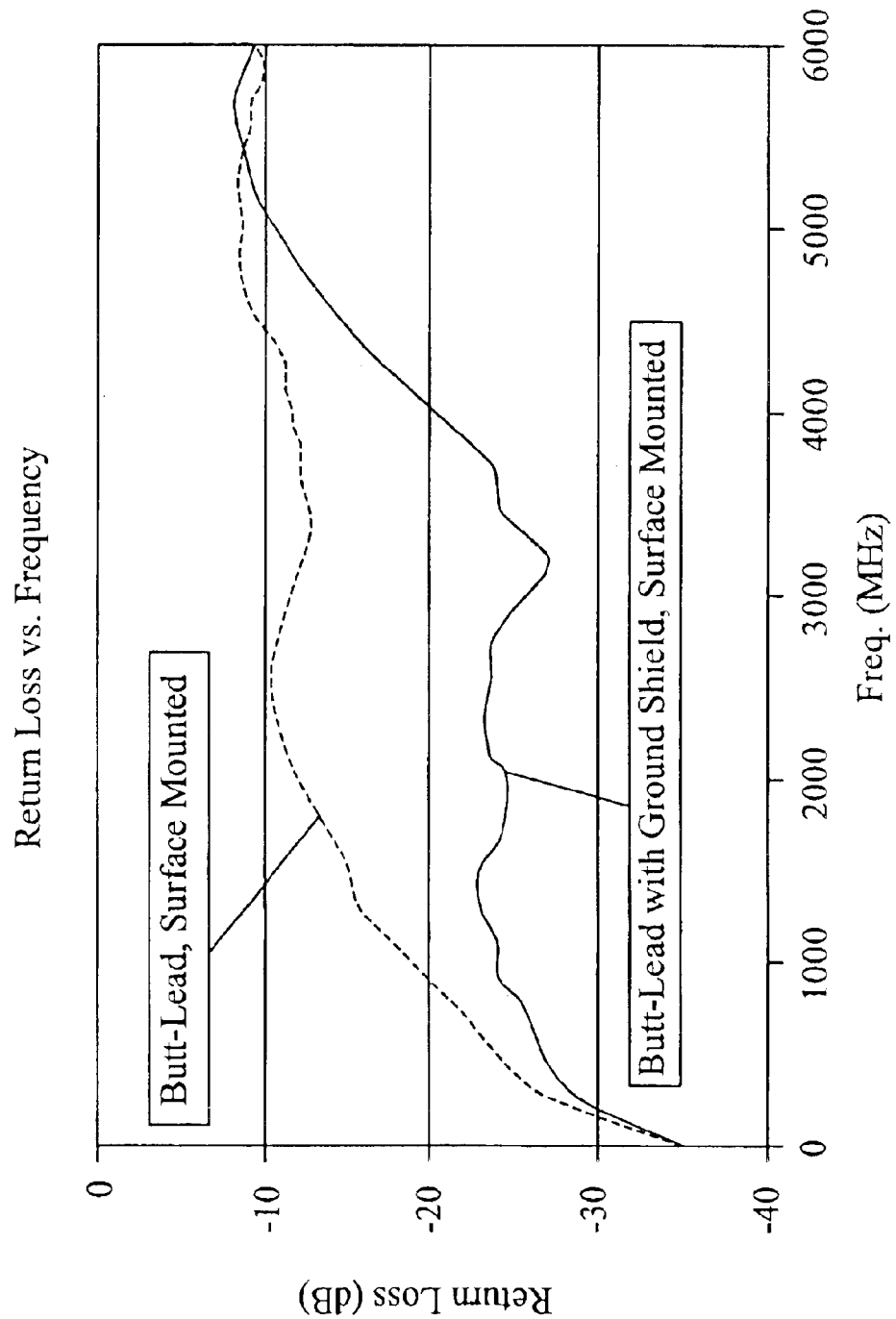

FIG. 1L shows representative plots of return loss versus RF signal frequency from output to input ports. The broken line plot corresponds to a surface mounted butt-lead electromechanical relay when used without a RF ground shield 50. The solid line plot corresponds to the same type of relay when used with a RF ground shield 50 attached to its enclosure, and surface mounted to a RF test PCB. As demonstrated by the plots, the electromechanical relay with the RF ground shield 50 shows a much lower return loss over most of the frequency range.

In the coil de-energized state, by shunting fugitive radiated signals to the PCB RF ground plane 86 from the first conductor lead 11, the third conductor lead 13, associated solder fillets, and shielded portions of associated circuit traces, rather than allowing the radiated signals to interact with each other, the RF ground shield 50 also achieves the objective of minimizing the insertion loss from the input port to the output port.

Figure 1M:
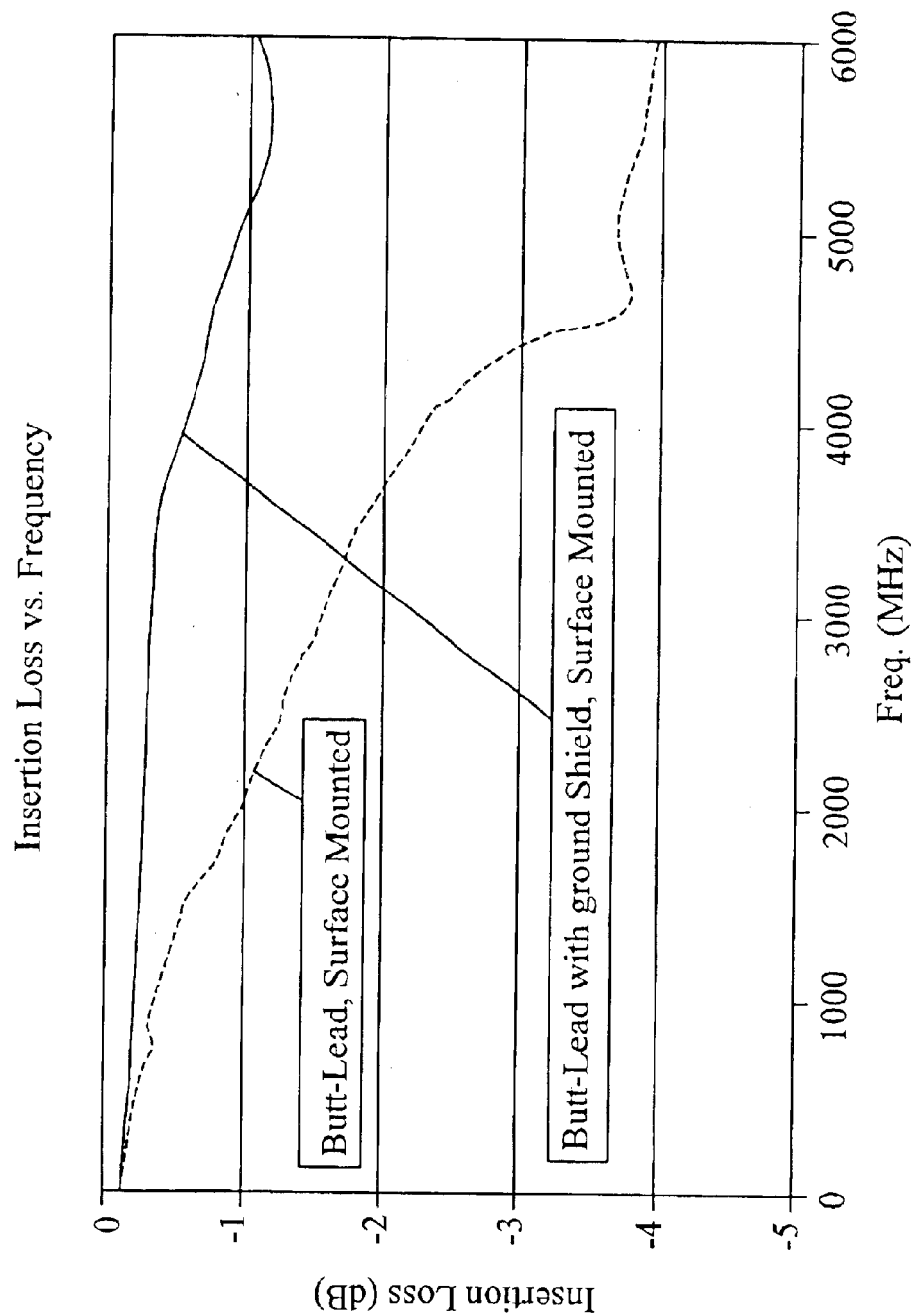

FIG. 1M shows representative plots of insertion loss versus RF signal frequency from the input port to the output port. The broken line plot corresponds to a surface mounted butt-lead electromechanical relay when used without a RF ground shield 50. The solid line plot corresponds to the same type of relay when used with a RF ground shield 50 attached to its enclosure, and surface mounted to a RF test PCB. As demonstrated by the plots, the electromechanical relay with the RF ground shield 50 shows a much lower insertion loss over the frequency range.

Finally, in the relay coil de-energized state, the extensions 91–98 and the central portion 99 of the RF ground shield 50 isolate fugitive radiated RF signals from Pole 1 normally closed contact path leads, associated solder fillets, and portions of associated circuit traces from leaking over to and being carried in the RF signal paths of Pole 2. That is, the RF ground shield 50 shunts to the PCB RF ground plane 86 substantially all fugitive radiated signals from the first conductor lead 11 and the third conductor lead 13 of Pole 1, from the associated solder fillets, and from shielded portions of the associated circuit traces, thus minimizing leakage of fugitive radiated RF signals to the signal paths associated with one or more of the fifth conductor lead 15, the sixth conductor lead 16, and the seventh conductor lead 17 of Pole 2. This shunting of fugitive radiated RF signals to the PCB RF ground plane 86 results in increased RF signal isolation between Pole 1 and Pole 2 RF signal paths, thereby, achieving maximum isolation between poles.

Figure 1N:
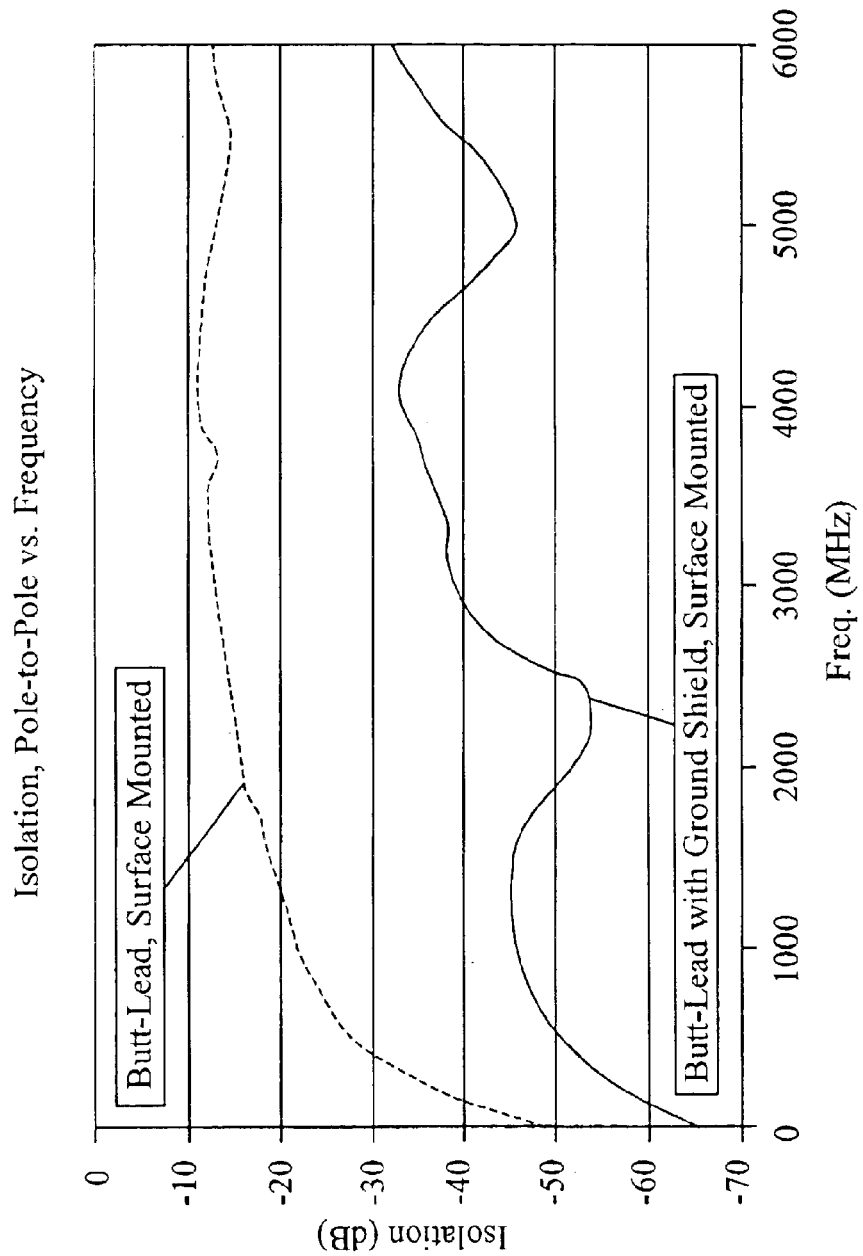

FIG. 1N shows representative plots of isolation between poles versus RF signal frequency. The broken line plot corresponds to a surface mounted butt-lead electromechanical relay when used without a RF ground shield 50. The solid line plot corresponds to the same type of relay when used with a RF ground shield 50 attached to its enclosure, and surface mounted to a RF test PCB. As demonstrated by the plots, the electromechanical relay with the RF ground shield 50 shows significantly higher RF signal isolation between poles over the frequency range.

Turning now to implementations of the relay coil energized state, RF signals pass from input port through an associated circuit trace, associated solder fillet, and first conductor lead 11 to the output port through the second conductor lead 12, associated solder fillet, and associated circuit trace. Radiated signals from the first conductor lead 11, associated solder fillet, and shielded portion of associated circuit trace and from the second conductor lead 12, associated solder fillet 81, and shielded portion of associated circuit trace arc shunted to component side RF ground plane 82 and then to PCB ground plane 86 by way of conductive vias 85. Therefore, almost all of the fugitive radiated RF signals from the first conductor leads 11 and the second conductor lead 12, associated solder fillets, and portions of associated traces are shunted to ground before such fugitive signals may be picked-up and carried in the third conductor lead 13, associated solder fillet, and portions of the associated circuit trace. This shunting of fugitive radiated RF signals to the PCB RF ground plane 86 due to the effects of RF ground shield 50, extensions 91–98, and the RF ground shield central portion 99 results in increased signal isolation in Pole 1 across the normally open contact signal path and normally closed contact signal path, thereby, achieving the objective of maximizing the isolation across contacts in the relay coil energized state.

FIG. 1K shows representative plots of isolation across contacts versus RF signal frequency. The broken line plot corresponds to a surface mounted butt-lead electromechanical relay when used without a RF ground shield 50. The solid line plot corresponds to the same type of relay when used with a RF ground shield 50 attached to its enclosure, and surface mounted to a RF test PCB. As demonstrated by the plots, the electromechanical relay with the RF ground shield 50 shows significantly higher RF signal isolation across contacts over the frequency range.

In the relay coil energized state, RF signals are passed through the normally open contact path from the input port through an associated circuit trace, associated solder fillet, and the first conductor lead 11 to the output port through the second conductor lead 12, associated solder fillet, and associated circuit trace. Radiated signals from the first conductor lead 11, associated solder fillet, and shielded portion of the associated circuit trace and from the second conductor lead 12, associated solder fillet, and shielded portion of associated circuit trace are shunted to component side RF ground plane 82 and then to PCB ground plane 86 by way of conductive vias 85. Therefore, substantially all of the fugitive radiated RF signals from the first conductor lead 11, associated solder fillet, and portions of the associated circuit trace are shunted to the RF ground plane 86 before such fugitive signals can be picked-up and carried in the second conductor lead 12, associated solder fillet, and portions of the associated circuit trace, or vice versa. This shunting of fugitive radiated RF signals to PCB RF ground plane 86 due to the effects of RF ground shield 50, extensions 91–98, and RF ground shield central portion 99 results in minimal return of RF signals from the output signal path associated with the second conductor lead 12 to the input signal path associated with the first conductor lead 11, thereby, achieving the objective of minimizing the RF signal return loss from output to input ports.

FIG. 1L shows representative plots of return loss versus RF signal frequency from output to input ports. The broken line plot corresponds to a surface mounted butt-lead electromechanical relay when used without a RF ground shield 50. The solid line plot corresponds to the same type of relay when used with a RF ground shield 50 attached to its enclosure, and surface mounted to a RF test PCB. As demonstrated by the plots, the electromechanical relay with the RF ground shield 50 shows a much lower return loss over most of the frequency range.

For the relay coil energized state, by shunting fugitive radiated signals to PCB RF ground plane 86, from the first conductor lead 11, the second conductor lead 12, associated solder fillets, and shielded portions of associated circuit traces, rather than allowing the fugitive radiated signals to interacting with each other, the RF ground shield 50 achieves the object of minimizing the insertion loss from the input port to the output port.

FIG. 1M shows representative plots of insertion loss versus RF signal frequency from the input port to the output port. The broken line plot corresponds to a surface mounted butt-lead electromechanical relay when used without a RF ground shield 50. The solid line plot corresponds to the same type of relay when used with a RF ground shield 50 attached to its enclosure, and surface mounted to a RF test PCB. As demonstrated by the plots, the electromechanical relay with the RF ground shield 50 shows a much lower insertion loss over the frequency range.

Finally, in the relay coil energized state, extensions 91–98 and RF ground shield central portion 99 isolate fugitive radiated RF signals from Pole 1 normally open contact path leads, associated solder fillets, and portions of associated circuit traces from leaking over to and carried in the RF signal paths of Pole 2. That is, RF ground shield 50 shunts to PCB RF ground plane 86 substantially all fugitive radiated signals from the first conductor lead 11 and the second conductor lead 12 of Pole 1, from the associated solder fillets, and from shielded portions of associated circuit traces, thus minimizing leakage of fugitive radiated RF signals to signal paths associated with one or more of the fifth conductor lead 15, the sixth conductor lead 16, and the seventh conductor lead 17 of Pole 2. This shunting of fugitive radiated RF signals to the PCB RF ground plane 86 results in increased RF signal isolation between the RF signal paths of Pole 1 and Pole 2, thereby achieving maximum isolation between poles.

FIG. 1N shows representative plots of isolation between poles versus RF signal frequency. The broken line plot corresponds to a surface mounted butt-lead electromechanical relay when used without a RF ground shield 50. The solid line plot corresponds to the same type of relay when used with a RF ground shield 50 attached to its enclosure, and surface mounted to a RF test PCB. As demonstrated by the plots, the electromechanical relay with the RF ground shield 50 shows significantly higher RF signal isolation between poles over the frequency range.

The discussions above regarding RF signals passing through Pole 1 normally closed contact path, or normally open contact path, for the relay coil de-energized, or relay coil energized state, respectively are also applicable to implementations where RF signals pass through Pole 2 normally closed contact signal paths, the seventh conductor lead 17 and the fifth conductor lead 15, and the normally open contact signal path leads 17 and 16, associated solder fillets, and associated circuit traces.

Some of the previous examples describe implementations where each pole is used as a separate RF signal path circuit. Similar benefits may be realized, however, using the assembly 80 in implementations where a device is connected between the normally closed contact paths of Pole 1 and Pole 2 and/or a device is connected between the normally open contact paths of Pole 1 and Pole 2.

For applications where digital signals are used, improved RF performance metrics in the time domain may be realized when the assembly 80 is surface mounted to a PCB. In such implementations, both the digital RF signal propagation delay time and pulse rise time characteristics may be reduced. That is, a surface mounted butt-lead electromechanical relay when used with a RF ground shield 50 attached to its enclosure, and surface mounted to a RF test PCB experiences significantly lower propagation delay time and pulse rise times when compared to the same type of relay when used without a RF ground shield 50 and surface mounted to a PCB. Thus, use of electromechanical relays with an attached or integral RF ground shield 50, in RF time-domain applications, yields the desired lower time measurements.

As described above, the RF ground shield 50 is structured and arranged to isolate and shunt radiated signals from each RF signal path lead, associated solder fillets, and some portions of the PCB RF signal circuit traces. According to aspects of the present invention, by isolating the leads of individual signal path and shunting unwanted radiated signals to the RF ground plane of a PCB, measurable improvements in RF operating characteristics result in the frequency domain and in the time domain as compared to the RF performance characteristics for surface-mounted axial lead relays with or without the assistance of other discrete grounding attachments. Namely, isolation of RF signals across contacts is increased, isolation of RF signals across poles (for multipole devices) is increased, the return loss of RF signals is reduced, insertion loss of RF signals is reduced, propagation delay time is lowered, and pulse rise time is lowered. In addition, the RF ground shield improves RF operating characteristics over a broader frequency bandwidth.

It should be noted, however, that the embodiments and examples described above are provided by way of illustration only and are not intended to limit the aspects of the present invention to particular implementations. Indeed, aspects of the present invention may find applicability in the alternative embodiments below as well as in other implementations and in various modifications of such embodiments and implementations.

Referring to FIGS. 2A-4D, alternative embodiments of an assembly including an attached and/or integral RF ground shield are illustrated. As demonstrated by these embodiments, a RF ground shield may be used with non-latching and/or latching (e.g., magnetic latching) axial lead devices (e.g., electromechanical relays) having various geometrical configurations. In addition, the number of axial leads included in such axial lead devices may vary.

Figure 2A:
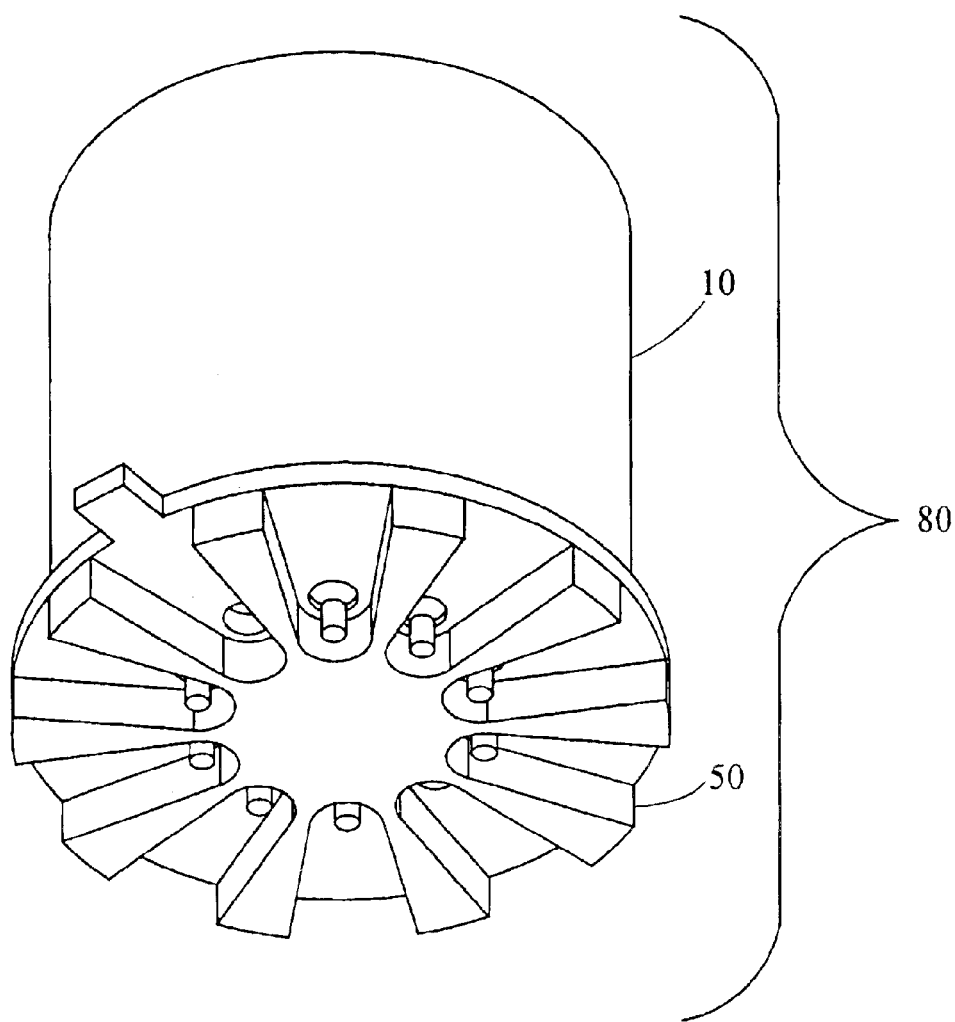
FIGS. 2A-4D illustrate other embodiments of an assembly according to aspects of the present invention.

FIG. 2A illustrates one embodiment of a RF ground shield assembly 80 including an axial lead device having a circular lead pattern. The axial lead device may include a non-latching electromechanical relay 10, for example. As shown, in this embodiment, the relay 10 includes eight conductor leads isolated by a circular RF ground shield 50 having ten extensions. In general, the RF ground shield assembly 80 may function and provide improved RF operating characteristics in accordance with aspects of the present invention described above.

Figure 2B:
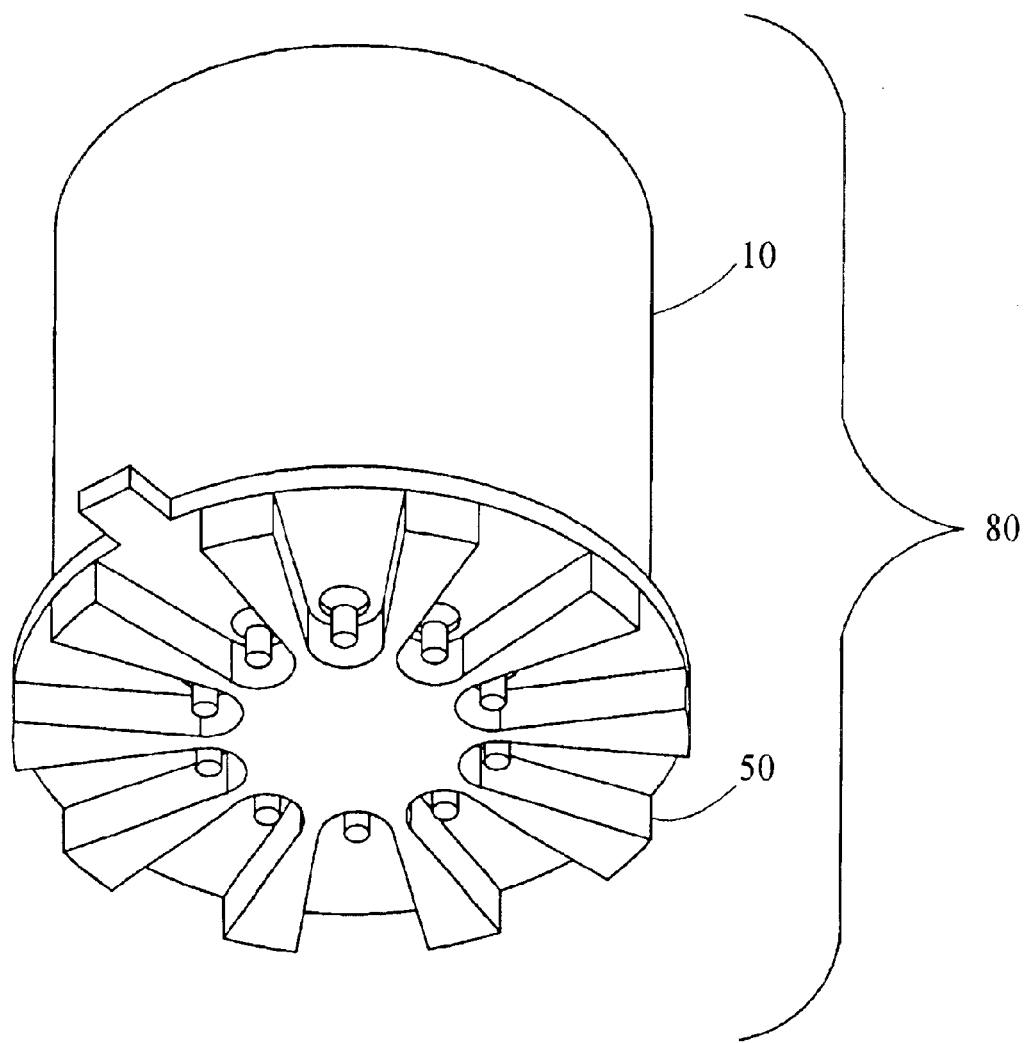

FIG. 2B illustrates another embodiment of a RF ground shield assembly 80 including an axial lead device having a circular lead pattern. The axial lead device may include a latching electromechanical relay 10, for example. As shown, in this embodiment, the relay 10 includes ten conductor leads isolated by a circular RF ground shield 50 having ten extensions extending outwardly from a central portion. In general, the RF ground shield assembly 80 may function and provide improved RF operating characteristics in accordance with aspects of the present invention described above.

Figure 2C:
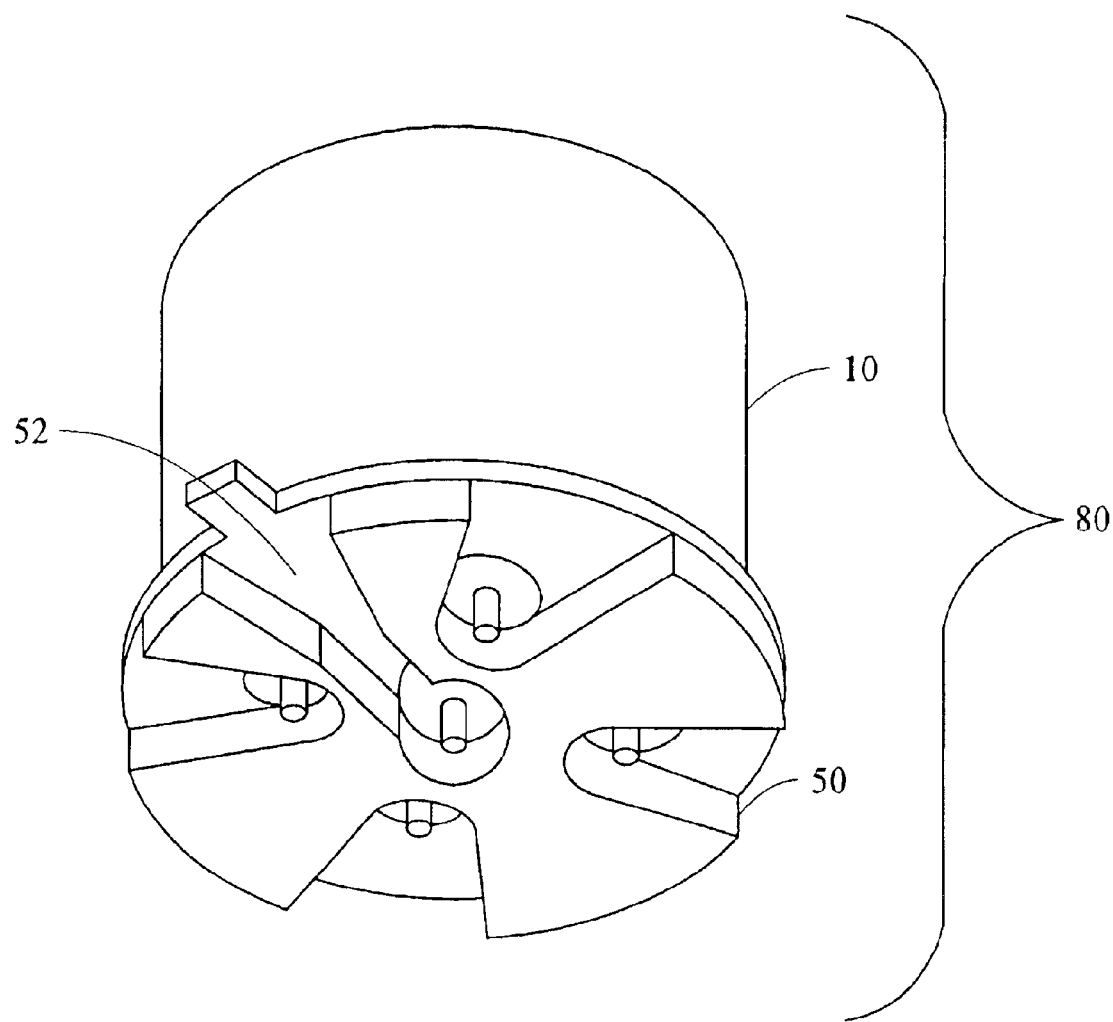

FIG. 2C illustrates yet another embodiment of a RF ground shield assembly 80 including an axial lead device having a circular lead pattern. The axial lead device may include a non-latching electromechanical relay 10, for example. As shown, the relay 10 includes five conductor leads isolated by a circular RF ground shield 50 having five extensions extending outwardly from a central portion. In this embodiment, the RF ground shield 50 may be structured and arranged to accommodate a conductor lead extending from a central portion of the axial lead device. For example, the RF ground shield 50 may include a slot 52 that extends into the central portion to receive the conductor lead. In general, the RF ground shield assembly may function and provide improved RF operating characteristics in accordance with aspects of the present invention described above.

Figure 2D:
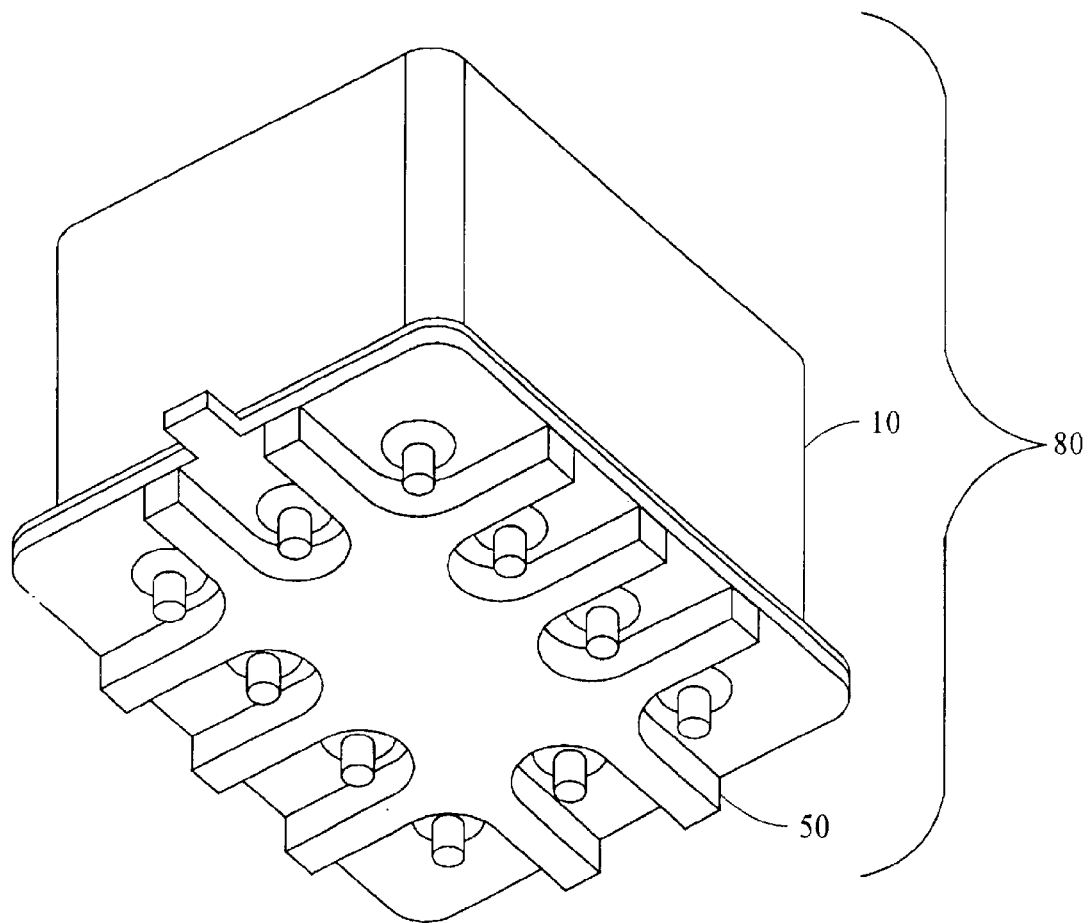

FIG. 2D illustrates an embodiment of a RF ground shield assembly 80 including an axial lead device having a rectangular grid pattern. The axial lead device may include a latching electromechanical relay 10, for example. As shown, in this embodiment, the relay 10 includes ten conductor leads isolated by a rectangular RF ground shield 50 having ten extensions extending outwardly from a central portion. In general, the RF ground shield assembly 80 may function and provide improved RF operating characteristics in accordance with aspects of the present invention described above.

Figure 3A:
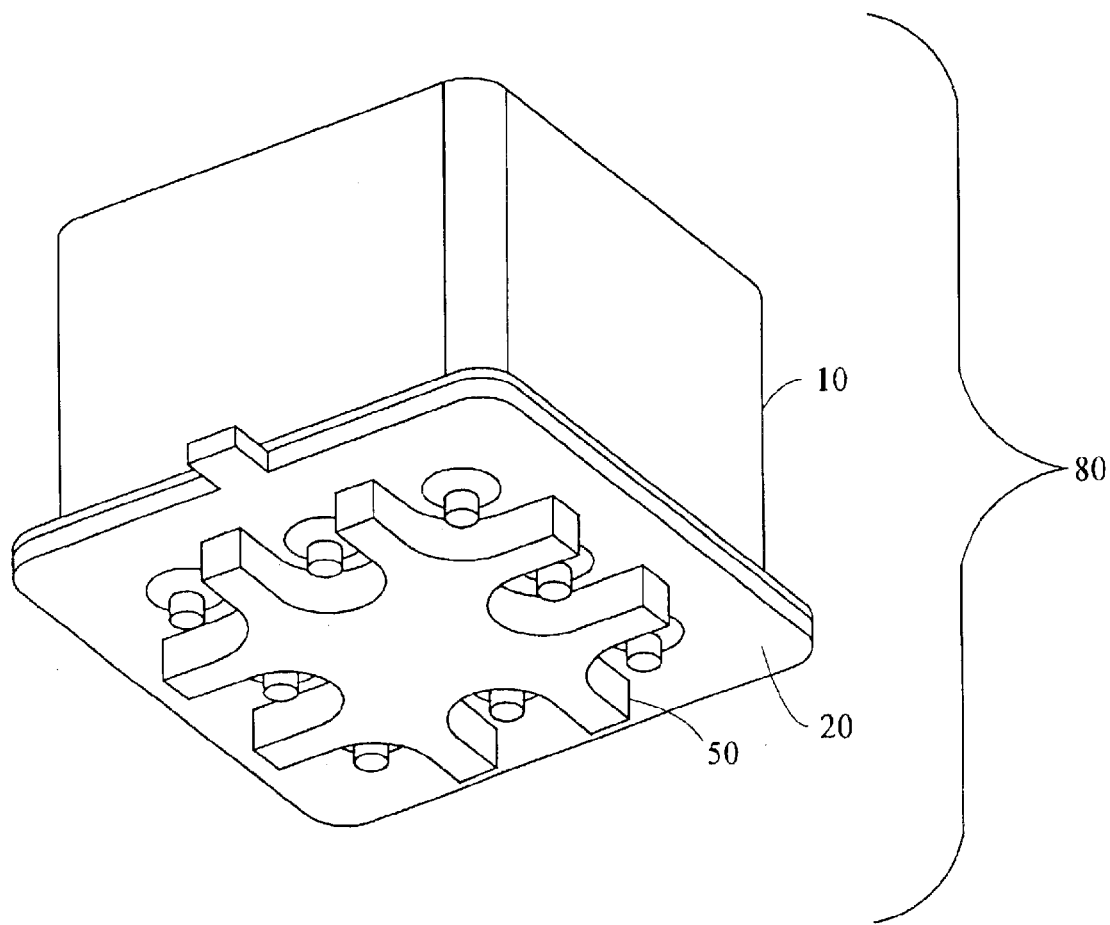

FIG. 3A illustrates an embodiment of a RF ground shield assembly 80 including an axial lead device having a square grid pattern. The axial lead device may include a non-latching electromechanical relay 10, for example. As shown, the relay 10 includes eight conductor leads isolated by a RF ground shield 50 having eight extensions extending outwardly from a central portion. In contrast to the embodiment of FIG. 1B, for instance, the eight extensions do not extend to the periphery of the header base 20 of the relay. Otherwise, the RF ground shield assembly 80 generally may function and provide improved RF operating characteristics in accordance with aspects of the present invention described above.

Figure 3B:
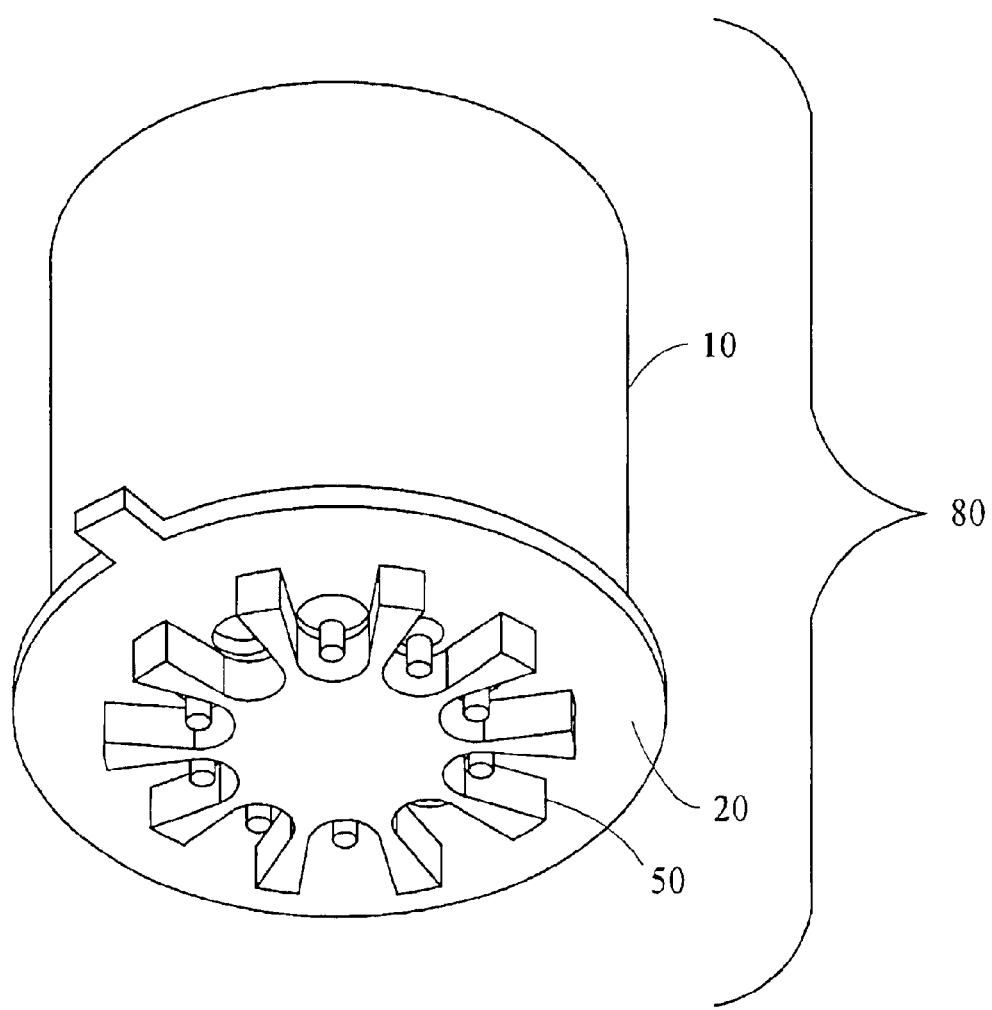

FIG. 3B illustrates one embodiment of a RF ground shield assembly 80 including an axial lead device having a circular lead pattern. The axial lead device may include a non-latching electromechanical relay 10, for example. As shown, the relay 10 includes eight conductor leads isolated by a circular RF ground shield 50 having ten extensions extending outwardly from a central portion. In contrast to the embodiment of FIG. 2A, for instance, the ten extensions do not extend to the periphery of the header base 20 of the relay. Otherwise, the RF ground shield assembly 80 generally may function and provide improved RF operating characteristics in accordance with aspects of the present invention described above.

Figure 3C:
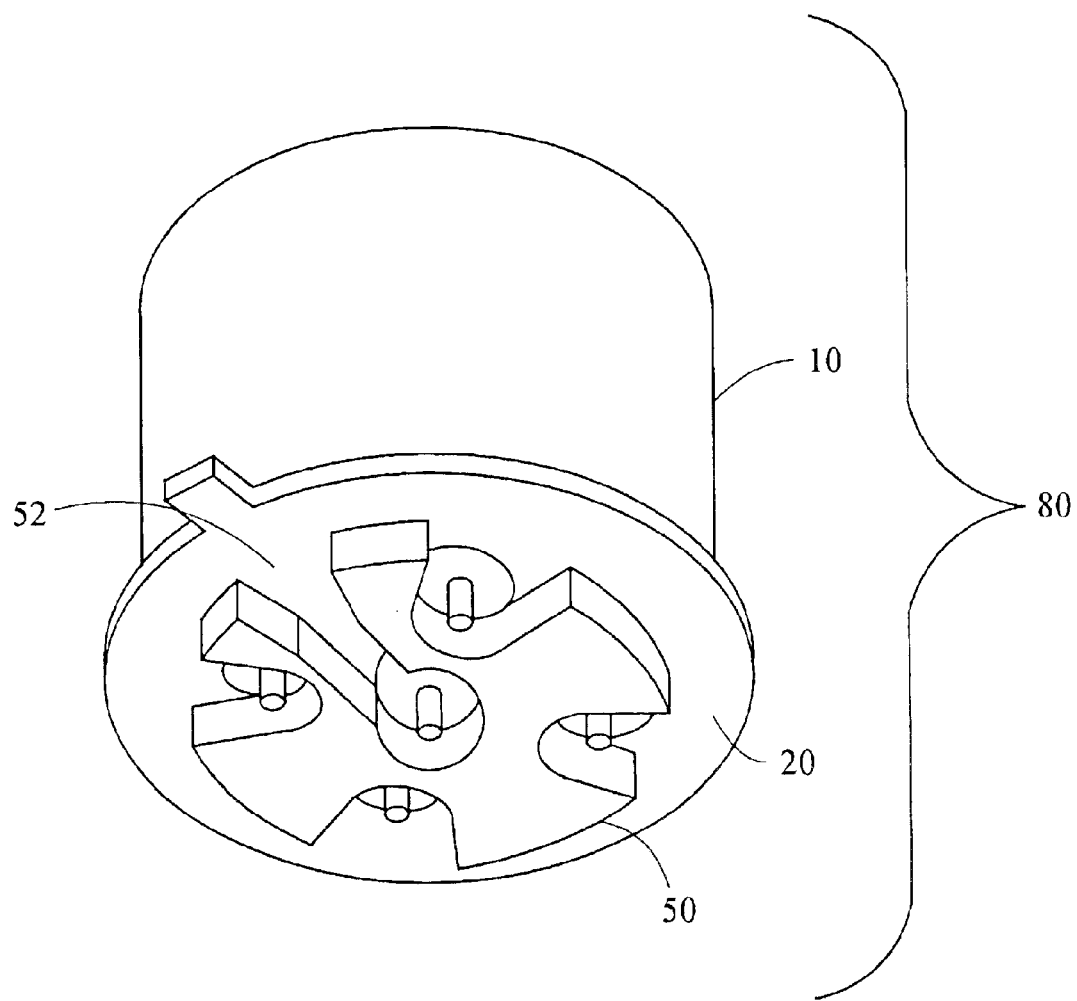

FIG. 3C illustrates another embodiment of a RF ground shield assembly 80 including an axial lead device having a circular lead pattern. The axial lead device may include a non-latching electromechanical relay 10, for example. As shown, the relay 10 includes five conductor leads isolated by a circular RF ground shield 50 having five extensions extending outwardly from a central portion. In this embodiment, the RF ground shield 50 may be structured and arranged to accommodate a conductor lead extending from a central portion of the axial lead device. For example, the RF ground shield 50 may include a slot 52 that extends into the central portion to receive the conductor lead. In contrast to the embodiment of FIG. 2C, for instance, the five extensions do not extend to the periphery of the header base 20 of the relay. Otherwise, the RF ground shield assembly 80 generally may function and provide improved RF operating characteristics in accordance with aspects of the present invention described above.

Figure 3D:
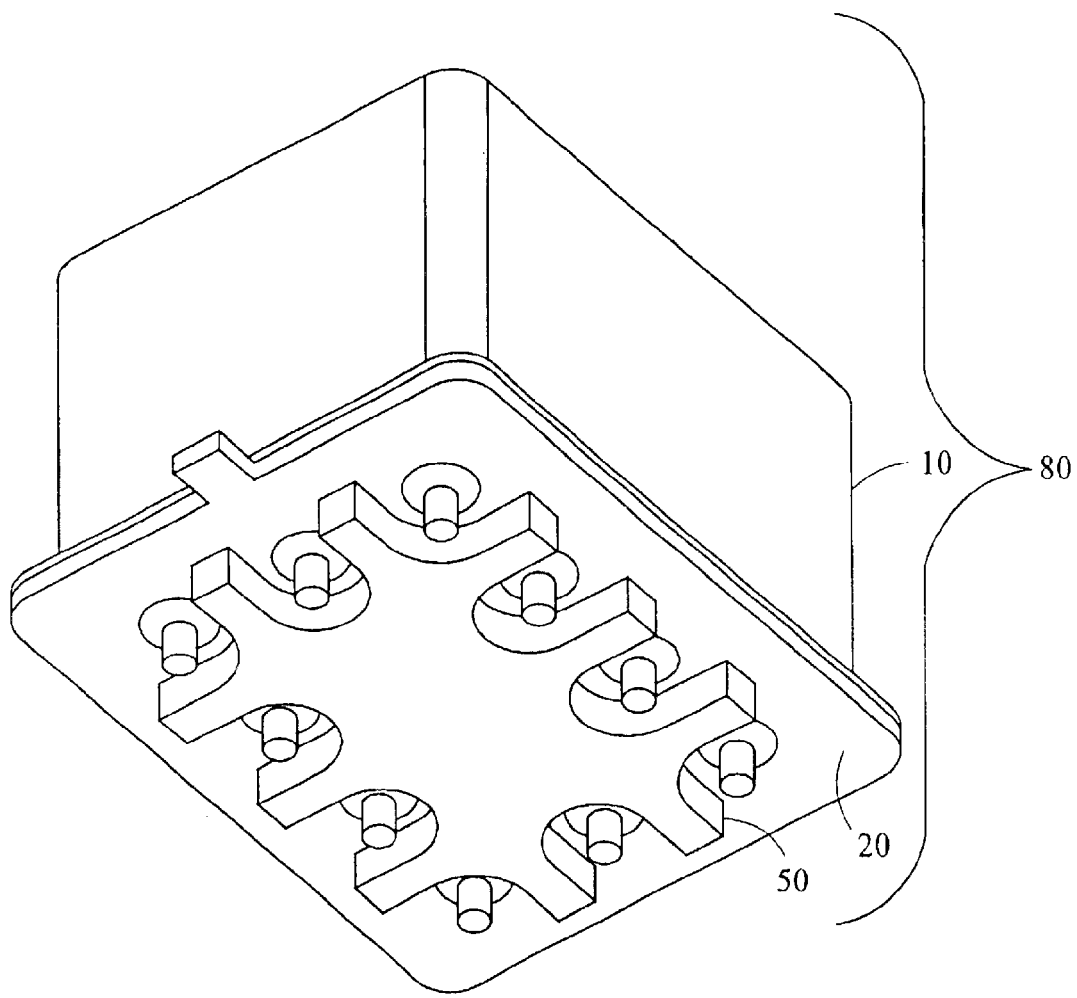

FIG. 3D illustrates an embodiment of a RF ground shield assembly 80 including an axial lead device having a rectangular grid pattern. The axial lead device may include a latching electromechanical relay 10, for example. As shown, in this embodiment, the relay 10 includes ten conductor leads isolated by a rectangular RF ground shield 50 having ten extensions extending outwardly from a central portion. In contrast to the embodiment of FIG. 2D, for instance, the ten extensions do not extend to the periphery of the header base 20 of the relay. Otherwise, the RF ground shield assembly 80 generally may function and provide improved RF operating characteristics in accordance with aspects of the present invention described above.

Figure 4A:
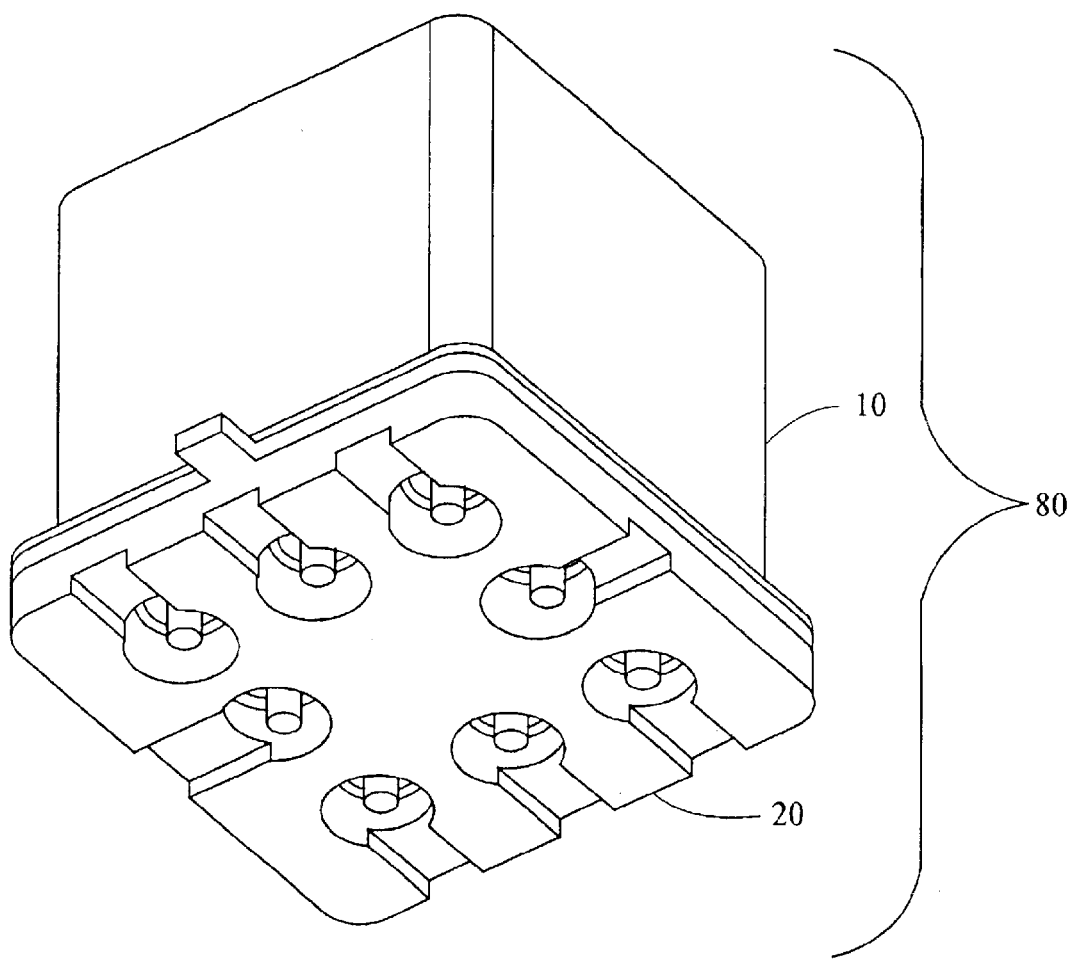

FIG. 4A illustrates an embodiment of a RF ground shield assembly 80 including an axial lead device having a square grid pattern. The axial lead device may include a non-latching electromechanical relay 10, for example. As shown, the relay 10 includes eight conductor leads isolated by a RF ground shield 50 having eight extensions extending outwardly from a central portion. In contrast to the embodiment of FIG. 1B, for instance, the RF ground shield may be structured and arranged to completely surround the leads of the relay 10. In this implementation, the bottom side RF ground shield 50 may include slots that are closed by the outer edges of the RF ground shield and that are sufficiently large to provide clearance with associated circuit traces. The clearance between the ground shield slots and associated circuit traces provides electrical isolation between the RF ground shield 50 and the associated circuit traces. Furthermore, in some cases, the RF ground shield 50 may be made from two separate pieces, with one shield piece surrounding the periphery of the other shield piece. Otherwise, the RF ground shield assembly 80 may function and provide improved RF operating characteristics in accordance with aspects of the present invention described above.

Figure 4B:
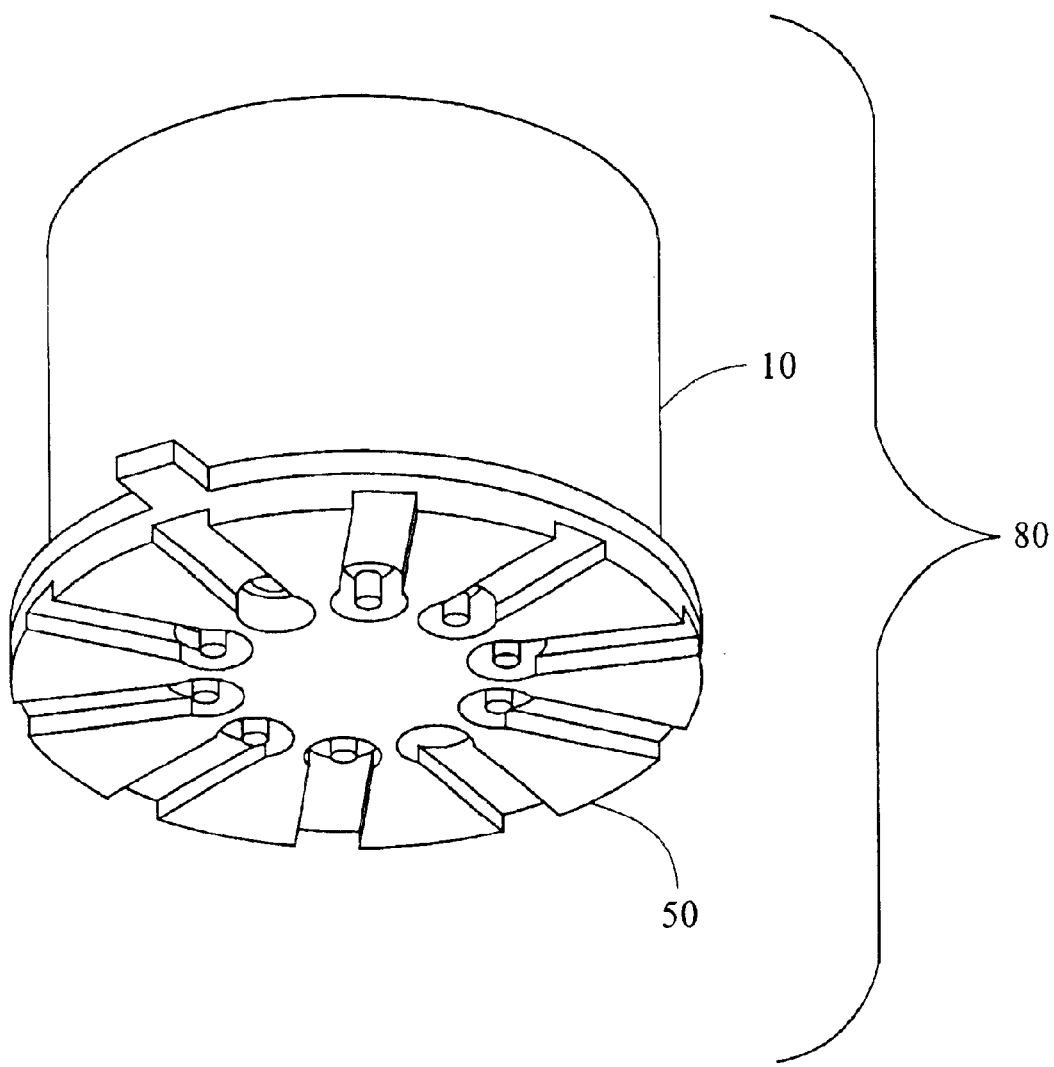

FIG. 4B illustrates one embodiment of a RF ground shield assembly 80 including an axial lead device having a circular lead pattern. The axial lead device may include a non-latching electromechanical relay 10, for example. As shown, the relay 10 includes eight conductor leads isolated by a circular RF ground shield 50 having ten extensions extending outwardly from a central portion. In contrast to the embodiment of FIG. 2A, for instance, the RF ground shield may be structured and arranged to completely surround the leads of the relay 10. In this implementation, the bottom side RF ground shield 50 may include slots that are closed by the outer edges of the RF ground shield and that are sufficiently large to provide clearance with associated circuit traces. The clearance between the ground shield slots and associated circuit traces provides electrical isolation between the RF ground shield 50 and the associated circuit traces. Furthermore, in some cases, the RF ground shield 50 may be made from two separate pieces, with one shield piece surrounding the periphery of the other shield piece. Otherwise, the RF ground shield assembly 80 may function and provide improved RF operating characteristics in accordance with aspects of the present invention described above.

Figure 4C:
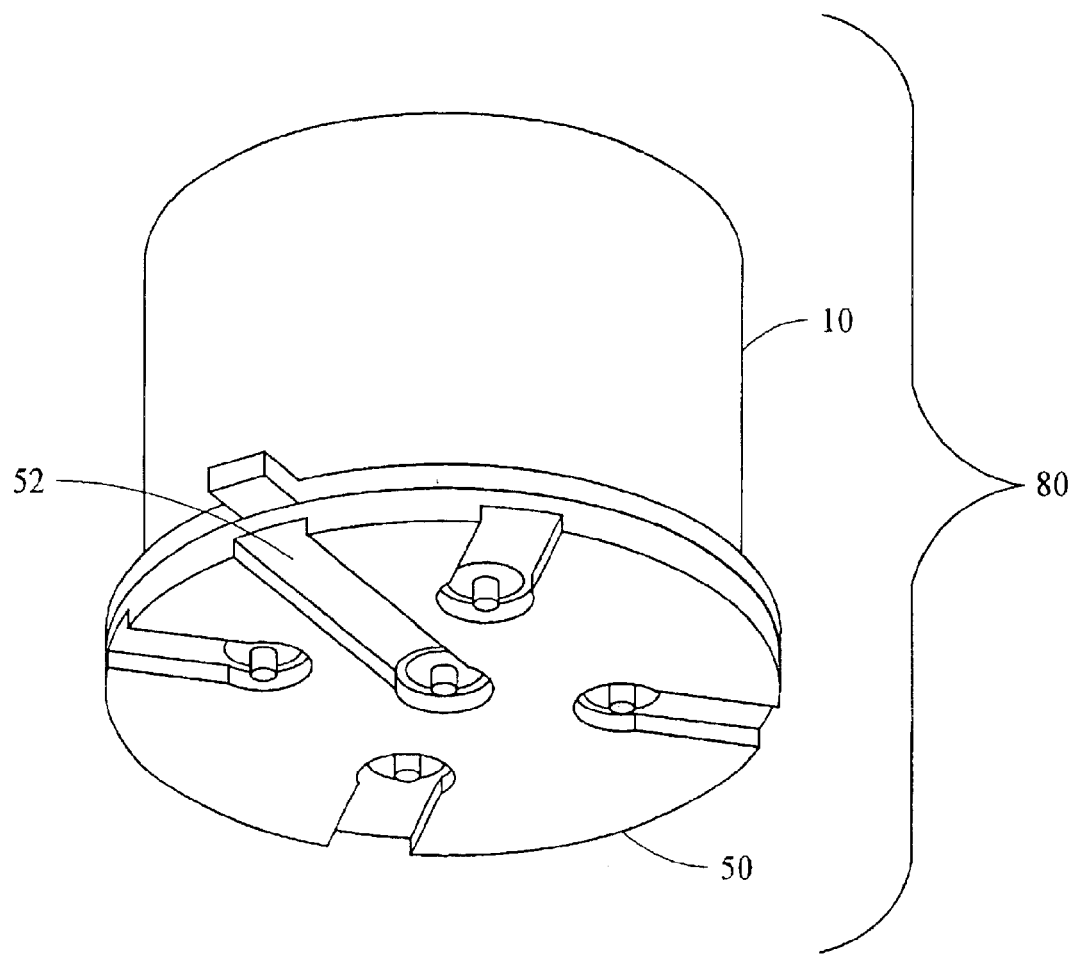

FIG. 4C illustrates another embodiment of a RF ground shield assembly 80 including an axial lead device having a circular lead pattern. The axial lead device may include a non-latching electromechanical relay 10, for example. As shown, the relay 10 includes five conductor leads isolated by a circular RF ground shield 50 having five extensions extending outwardly from a central portion. In this embodiment, the RF ground shield 50 may be structured and arranged to accommodate a conductor lead extending from a central portion of the axial lead device. For example, the RF ground shield 50 may include a slot 52 that extends into the central portion to receive the conductor lead. In contrast to the embodiment of FIG. 2C, for instance, the RF ground shield also may be structured and arranged to completely surround the leads of the relay 10. In this implementation, the bottom side RF ground shield 50 may include slots that are closed by the outer edges of the RF ground shield and that are sufficiently large to provide clearance with associated circuit traces. The clearance between the ground shield slots and associated circuit traces provides electrical isolation between the RF ground shield 50 and the associated circuit traces. Furthermore, in some cases, the RF ground shield 50 may be made from two separate pieces, with one shield piece surrounding the periphery of the other shield piece. Otherwise, the RF ground shield assembly 80 may function and provide improved RF operating characteristics in accordance with aspects of the present invention described above.

Figure 4D:
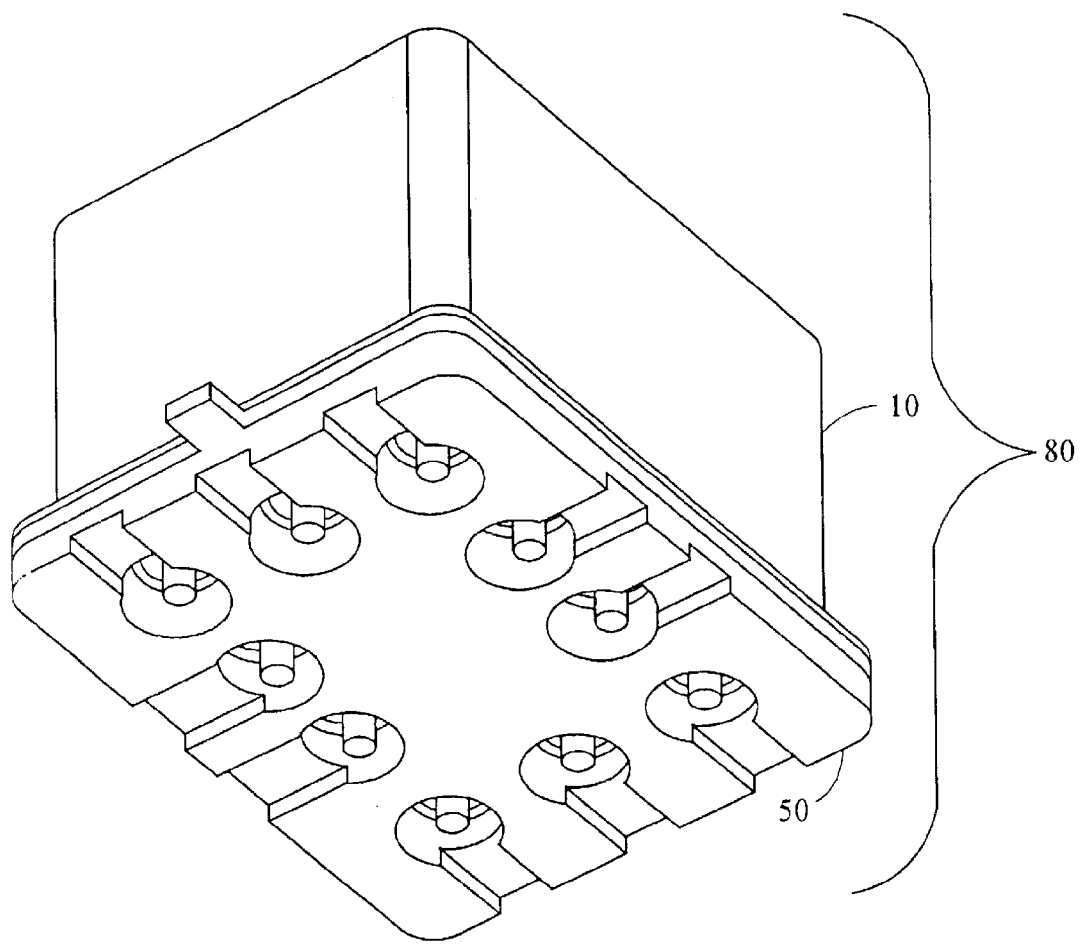

FIG. 4D illustrates an embodiment of a RF ground shield assembly 80 including an axial lead device having a rectangular grid pattern. The axial lead device may include a latching electromechanical relay 10, for example. As shown, the relay 10 includes ten conductor leads isolated by a rectangular RF ground shield 50 having ten extensions extending outwardly from a central portion. In contrast to the embodiment of FIG. 2D, for example, the RF ground shield may be structured and arranged to completely surround the leads of the relay 10. For instance, the bottom side RF ground shield 50 may include slots that are closed by the outer edges of the RF ground shield and that are sufficiently large to provide clearance with associated circuit traces. The clearance between the ground shield slots and associated circuit traces provides electrical isolation between the RF ground shield 50 and the associated circuit traces. Furthermore, in some cases, the RF ground shield 50 may be made from two separate pieces, with one shield piece surrounding the periphery of the other shield piece. Otherwise, the RF ground shield assembly 80 may function and provide improved RF operating characteristics in accordance with aspects of the present invention described above.

Aspects of the present invention include further implementations and/or modifications of the previously described embodiments. For example, other variations regarding the structure and arrangement of the RF ground shield 50 and/or axial lead devices (e.g., electromechanical relays) are contemplated and may be used effectively in RF signal switching applications.

In some implementations, for instance, a RF ground shield having extensions that extend from a central portion beyond the periphery of the enclosure of the axial lead device may be used effectively in RF signal switching applications. Additionally, in some implementations, the shape of the perimeter of the RF ground shield and the shape of the perimeter of the axial lead device may not correspond. For example, a RF ground shield having a substantially square perimeter formed by the periphery of its extensions may be used with an axial lead device with a circular lead pattern. Furthermore, the orientation of the slots may be implemented in a variety of ways. For example, localized variants of the RF slots shown above may include features such as tapered walls in lieu of vertical walls perpendicular to the PCB mounting surface.

Other implementations are within the scope of the following claims.

What is claimed is:

1. An apparatus for protecting conductor leads of an axial lead device, the apparatus comprising:

a conductive shield including one or more openings configured to receive a plurality of conductor leads exiting from a header base of the axial lead device, the conductive shield being structured and arranged to create an electrically conductive path to a ground common with said header base and to substantially surround a plurality of conductor leads received in the one or more openings such that each conductor lead is isolated from at least one other conductor lead, wherein at least one opening comprises a slot extending from a periphery of the conductive shield in a direction toward a central portion of the conductive shield, said slot being structured and arranged to provide access to a conductor lead from the periphery of the conductive shield when the axial lead device is surface mounted to a printed circuit board.

2. The apparatus of claim 1, wherein the conductive shield is configured to isolate and shunt radio frequency signals radiated by one or more of the plurality of conductor leads to a ground plane.

3. The apparatus of claim 1, wherein the conductive shield is configured to isolate and shunt radio frequency signals radiated by solder fillets and traces associated with the conductor leads to a ground plane when the axial lead device is surface mounted to a printed circuit board.

4. The apparatus of claim 1, wherein conductive shield is configured such that relative to the axial lead device, an assembly including the axial lead device and the conductive shield demonstrates one or more of higher isolation of radio frequency signals across contacts of the assembly, higher isolation of radio signals across poles of the assembly, lower return loss of radio frequency signals, lower insertion loss of radio frequency signals, lower propagation delay time, and faster pulse rise time.

5. The apparatus of claim 1, wherein the conductive shield comprises a single conductive plate.

6. The apparatus of claim 1, wherein the conductive shield comprises at least two conductive plates.

7. The apparatus of claim 1, wherein the conductive shield comprises at least one of plated metal, unplated metal, a semi-metallic material, and a dielectric material with conductive plating.

8. The apparatus of claim 1, wherein an opening in the shield comprises one of a slot and a corner opening.

9. The apparatus of claim 8, comprising a slot extending into a central portion of the conductive shield.

10. The apparatus of claim 1, wherein at least one opening is closed by an outer edge of the conductive shield.

11. The apparatus of claim 1, wherein at least one opening is configured to provide clearance with a circuit board trace and solder fillet associated with a received conductor lead.

12. The apparatus of claim 1, wherein the conductive shield comprises one or more walls that are relatively perpendicular to at least one of a top surface and a bottom surface of the conductive shield said walls forming boundaries of the one or more openings.

13. The apparatus of claim 12, wherein one or more walls are curvilinear.

14. The apparatus of claim 12, wherein one or more walls are tapered.

15. The apparatus of claim 1, wherein the one or more of the openings define a plurality of extensions, each extension being structured and arranged to isolate a plurality of conductor leads.

16. The apparatus of claim 15, wherein at least one extension extends from a central portion of the conductive shield to at least a periphery of the axial lead device.

17. The apparatus of claim 15, wherein at least one extension extends from a central portion of the conductive shield to at least one of: a periphery of the axial lead device, within the periphery of the axial lead device, or outside the periphery of the axial lead device.

18. The apparatus of claim 1, wherein at least one of a top surface and a bottom surface of the conductive shield has at least one of a smooth surface finish, an embossed surface finish, and an intermediate surface finish.

19. The apparatus of claim 1, wherein the conductive shield has a thickness substantially equal to a length from the axial lead device to a bottom surface of at least one conductor lead.

20. The apparatus of claim 1, wherein the conductive shield has at least one of a square perimeter, a circular perimeter, a rectangular perimeter, and a multisided curvilinear perimeter.

21. The apparatus of claim 1, wherein the conductive shield is structured and arranged for use with an off-the-shelf axial lead electromechanical relay device.

22. An assembly comprising:

an axial lead device including a plurality of conductor leads exiting from a header base of the axial lead device; and a conductive shield in contact with said header base, said conductive shield creating an electrically conductive path to ground common with said header base, said conductive shield including one or more openings receiving the plurality of conductor leads, the conductive shield substantially surrounding the plurality of conductor leads received in the one or more openings such that each conductor lead is isolated from at least one other conductor lead, wherein at least one opening comprises a slot extending from a periphery of the conductive shield in a direction toward a central portion of the conductive shield, said slot being structured and arranged to provide access to a conductor lead from the periphery of the conductive shield when the axial lead device is surface mounted to a printed circuit board.

23. The assembly of claim 22, wherein the conductive shield is configured to provide a common electrical path between the axial lead device enclosure and a printed circuit board radio frequency ground plane.

24. The assembly of claim 22, wherein the axial lead device comprises an axial lead electromechanical relay.

25. The assembly of claim 24, wherein the electromechanical relay comprises at least one of a double-pole/double-throw relay, a double-pole/single-throw relay, a single-pole/single-throw relay, a single-pole/double-throw relay, variants of the aforementioned contact configurations, and/or multi-pole relay.

26. The assembly of claim 24, wherein the electromechanical relay comprises at least one of an internal coil suppression diode, a polarity reversal protection diode, a transistor coil driver circuit, and an internal attenuator pad.

27. The assembly of claim 22, wherein the axial lead device is configured to be surface mounted to a printed circuit board.

28. The assembly of claim 27, wherein one or more of the plurality of conductor leads has a butt-lead configuration.

29. The assembly of claim 27, wherein one or more of the plurality of conductor leads includes an L-bend configuration.

30. The assembly of claim 22, wherein the axial lead device is operable in at least one of a de-energized state and an energized state.

31. The assembly of claim 22, wherein the axial lead device is a non-latching axial lead device.

32. The assembly of claim 31, wherein the axial lead device includes a magnetic latching axial lead device.

33. The assembly of claim 22, wherein the axial lead device includes at least one of a square lead pattern, a circular lead pattern, and a rectangular lead pattern.

34. The assembly of claim 22, wherein at least one conductor lead exits from a central portion of the axial lead device.

35. The assembly of claim 22, wherein one or more openings are located at a periphery of the assembly.

36. The assembly of claim 22, wherein the conductive shield is attached to the axial lead device by one or more of laser welding, resistance welding, soldering, and use of a conductive adhesive.

37. The assembly of claim 22, wherein the conductive shield is integral with the axial lead device.

38. The assembly of claim 37, wherein the conductive shield forms at least part of an enclosure of the axial lead device.

39. The assembly of claim 37, wherein the conductive shield forms part of an enclosure base of the axial lead device.

40. The assembly of claim 22, wherein substantially all of a bottom surface of the conductive shield is attached by conductive means to a printed circuit board radio frequency ground plane.

41. The assembly of claim 22, wherein a bottom surface of the conductive shield is attached by conductive means at discrete locations to a printed circuit board radio frequency ground plane.

42. The assembly of claim 22, wherein extensions side surfaces of the conductive shield are attached by conductive means to a printed circuit board radio frequency ground plane.

43. The assembly of claim 22, where substantially all of a bottom surface of the conductive shield touches a printed circuit board radio frequency ground plane.

44. The assembly of claim 22, wherein the conductive shield is attached by conductive means to or touching a printed circuit board radio frequency ground plane by one or a combination of: attaching by conductive means all of a bottom surface of the conductive shield to the printed circuit board radio frequency ground plane, attaching by conductive means the bottom surface of the conductive shield to the printed circuit board radio frequency ground plane at discrete locations, attaching by conductive means extension side surfaces of the conductive shield to a printed circuit board radio frequency ground plane, and touching substantially all of the bottom surface of the conductive shield to a printed circuit board radio frequency ground plane.

* * * * *

UNITED STATES PATENT AND TRADEMARK OFFICE
CERTIFICATE OF CORRECTION

PATENT NO. : 6,809,255 B1
APPLICATION NO. : 10/201465
DATED : October 26, 2004
INVENTOR(S) : Delo K. K. Chun It is certified that error appears in the above-identified patent and that said Letters Patent is hereby corrected as shown below:

Abstract, sentence 4, delete "other" and substitute therefor --higher--.

Column 3, line 60, delete "singlepole/" and substitute therefor --single-pole/--.

Column 6, line 61, delete "double pole-double throw" and substitute therefor --double-pole/double-throw--.

Column 7, line 25, delete "1-18" and substitute therefor --11-18--.

Column 8, line 26, delete "solder. 90" and substitute therefor --solder 90--.

Column 9, line 56, delete "provide for one" and substitute therefor --provide one--.

Column 9, line 61, delete "THe" and substitute therefor --The--.

Column 10, line 38, delete "contacts" and substitute therefor --contact--.

Column 10, line 40, delete "contacts" and substitute therefor --contact--.

Column 10, line 59, delete "arc" and substitute therefor --are--.

Column 11, line 27, delete "lead 1," and substitute therefor --lead 11,--.

Column 11, line 38, delete "devise," and substitute therefor --device--.

Column 11, line 46, delete "contract," and substitute therefor --contact--.

Column 15, line 60, delete "shied" and substitute therefor --shield--.

Column 16, line 65, delete "arc" and substitute therefor --are--.

Column 17, line 4, delete "picked-up" and substitute therefor --picked up--.

Column 17, line 65, delete "interacting" and substitute therefor --interact--.

UNITED STATES PATENT AND TRADEMARK OFFICE
CERTIFICATE OF CORRECTION

PATENT NO. : 6,809,255 B1
APPLICATION NO. : 10/201465
DATED : October 26, 2004
INVENTOR(S) : Delo K.K. Chun It is certified that error appears in the above-identified patent and that said Letters Patent is hereby corrected as shown below:

Column 26, line 1, delete "extensions" and substitute therefor --extension--.

Signed and Sealed this

Thirtieth Day of September, 2008

JON W. DUDAS
*Director of the United States Patent and Trademark Office*